United States Patent

Mittal et al.

(10) Patent No.: US 12,135,876 B2
(45) Date of Patent: Nov. 5, 2024

(54) MEMORY SYSTEMS HAVING CONTROLLERS EMBEDDED IN PACKAGES OF INTEGRATED CIRCUIT MEMORY

(71) Applicant: Micron Technology, Inc., Boise, ID (US)

(72) Inventors: Samir Mittal, Palo Alto, CA (US); Gurpreet Anand, Pleasanton, CA (US); Ying Yu Tai, Mountain View, CA (US); Cheng Yuan Wu, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/162,905

(22) Filed: Oct. 17, 2018

(65) Prior Publication Data

US 2019/0243787 A1 Aug. 8, 2019

Related U.S. Application Data

(60) Provisional application No. 62/626,527, filed on Feb. 5, 2018.

(51) Int. Cl.
*G06F 3/06* (2006.01)
*G06F 9/445* (2018.01)
(Continued)

(52) U.S. Cl.
CPC .......... *G06F 3/0611* (2013.01); *G06F 3/0647* (2013.01); *G06F 3/0679* (2013.01);
(Continued)

(58) Field of Classification Search
CPC .. G06F 13/1684; G06F 9/445; G06F 13/4234; G06F 13/4247; G06F 12/0246;
(Continued)

(56) References Cited

U.S. PATENT DOCUMENTS 5,390,334 A 2/1995 Harrison
5,727,150 A 3/1998 Laudon et al.
(Continued)

FOREIGN PATENT DOCUMENTS

CN 104391803 3/2015
CN 106506275 3/2017
(Continued)

OTHER PUBLICATIONS

Error Characterization, Mitigation and recovery by Cai (Year: 2017).*

(Continued)

*Primary Examiner* — Paul M Knight
(74) *Attorney, Agent, or Firm* — Greenberg Traurig

(57) ABSTRACT

A computing system having a memory component with an embedded media controller. The memory component is encapsulated within an integrated circuit (IC) package. The embedded controller within the IC package is configured to: receive incoming packets, via a serial communication interface of the controller, from a serial connection outside of the IC package; convert the incoming packets into commands and addresses according to a predetermined serial communication protocol; operate memory units encapsulated within the IC package according to the commands and the addresses; convert results of at least a portion of the commands into outgoing packets; and transmit the outgoing packets via the serial communication interface to the serial connection outside of the IC package.

9 Claims, 9 Drawing Sheets

(51) Int. Cl.
*G06F 12/02* (2006.01)
*G06F 13/16* (2006.01)
*G06F 13/42* (2006.01)
*G11C 16/20* (2006.01)

(52) U.S. Cl.
CPC ............ *G06F 3/0685* (2013.01); *G06F 9/445* (2013.01); *G06F 13/1684* (2013.01); *G06F 13/4234* (2013.01); *G06F 13/4247* (2013.01); *G11C 16/20* (2013.01)

(58) Field of Classification Search
CPC ...... G06F 3/0679; G06F 3/061; G06F 3/0611; G06F 3/0613; G06F 3/0647; G06F 3/0685; G11C 16/20
See application file for complete search history.

(56) References Cited

U.S. PATENT DOCUMENTS

| | | |
|---|---|---|
| 5,909,540 A | 6/1999 | Carter et al. |
| 5,918,229 A | 6/1999 | Davis et al. |
| 6,026,475 A | 2/2000 | Woodman |
| 6,230,260 B1 | 5/2001 | Luick |
| 6,247,097 B1 | 6/2001 | Sinharoy |
| 6,279,138 B1 | 8/2001 | Jadav et al. |
| 6,473,845 B1 | 10/2002 | Hornung et al. |
| 7,376,681 B1 | 5/2008 | Todd et al. |
| 8,082,400 B1 | 12/2011 | Chang et al. |
| 8,117,373 B2 | 2/2012 | Berlin |
| 8,131,814 B1 | 3/2012 | Schlansker et al. |
| 8,135,933 B2 | 3/2012 | Fisher et al. |
| 8,316,187 B2 | 11/2012 | Pothireddy |
| 8,352,709 B1 | 1/2013 | Glasco et al. |
| 8,560,761 B2 | 10/2013 | Tzeng |
| 8,700,724 B2 | 4/2014 | McDaniel et al. |
| 8,799,554 B1 | 8/2014 | Vincent et al. |
| 8,825,937 B2 | 9/2014 | Atkisson et al. |
| 8,838,887 B1 | 9/2014 | Burke et al. |
| 8,868,842 B2 | 10/2014 | Yano et al. |
| 8,930,647 B1 | 1/2015 | Smith |
| 8,965,819 B2 | 2/2015 | Tirunagari |
| 8,996,834 B2 | 3/2015 | Brenner et al. |
| 9,043,530 B1 | 5/2015 | Sundaram et al. |
| 9,047,017 B1 | 6/2015 | Dolan et al. |
| 9,104,555 B2 | 8/2015 | Liebowitz et al. |
| 9,122,503 B1 | 9/2015 | Hoff |
| 9,342,453 B2 | 5/2016 | Nale et al. |
| 9,535,740 B1* | 1/2017 | Graham ................ G06F 9/5077 |
| 9,619,408 B2 | 4/2017 | Nale et al. |
| 9,697,130 B2 | 7/2017 | Karippara et al. |
| 9,817,739 B1 | 11/2017 | Pise et al. |
| 9,910,618 B1 | 3/2018 | Curley et al. |
| 9,996,370 B1 | 6/2018 | Khafizov et al. |
| 10,019,279 B2 | 7/2018 | Bacher et al. |
| 10,120,797 B1 | 11/2018 | Foley et al. |
| 10,223,371 B2 | 3/2019 | Thirumal |
| 10,241,943 B2 | 3/2019 | Nale et al. |
| 10,282,322 B2 | 5/2019 | Nale et al. |
| 10,282,323 B2 | 5/2019 | Nale et al. |
| 10,289,566 B1 | 5/2019 | Dalmatov et al. |
| 10,289,958 B1* | 5/2019 | Tzur ................... G06F 3/0649 |
| 10,298,496 B1 | 5/2019 | Nakibly et al. |
| 10,339,056 B2 | 7/2019 | Joshi et al. |
| 10,394,789 B1 | 8/2019 | Animesh et al. |
| 10,430,723 B1 | 10/2019 | Tzur et al. |
| 10,514,855 B2 | 12/2019 | Voigt |
| 10,725,663 B2 | 7/2020 | Awasthi et al. |
| 10,782,908 B2 | 9/2020 | Mittal et al. |
| 10,852,949 B2 | 12/2020 | Frolikov et al. |
| 10,877,892 B2 | 12/2020 | Ray et al. |
| 10,880,401 B2 | 12/2020 | Maharana et al. |
| 11,099,789 B2 | 8/2021 | Maharana et al. |
| 11,354,056 B2 | 6/2022 | Mittal et al. |
| 11,416,395 B2 | 8/2022 | Ray et al. |
| 11,573,901 B2 | 2/2023 | Ray et al. |
| 11,669,260 B2 | 6/2023 | Mittal et al. |
| 11,706,317 B2 | 7/2023 | Maharana et al. |
| 11,740,793 B2 | 8/2023 | Frolikov et al. |
| 11,977,787 B2 | 5/2024 | Maharana et al. |
| 2002/0145919 A1 | 10/2002 | Lamb et al. |
| 2002/0196659 A1 | 12/2002 | Hurst et al. |
| 2003/0126232 A1 | 7/2003 | Mogul et al. |
| 2004/0186960 A1 | 9/2004 | Poggio |
| 2006/0087893 A1 | 4/2006 | Nishihara et al. |
| 2006/0095676 A1 | 5/2006 | Dzierzon et al. |
| 2006/0095679 A1 | 5/2006 | Edirisooriya |
| 2006/0206658 A1 | 9/2006 | Hendel et al. |
| 2007/0033367 A1 | 2/2007 | Sakarda et al. |
| 2007/0074093 A1 | 3/2007 | Lasser |
| 2007/0112864 A1 | 5/2007 | Ben-natan |
| 2007/0239977 A1 | 10/2007 | Wu |
| 2008/0016297 A1 | 1/2008 | Bartley et al. |
| 2008/0215826 A1 | 9/2008 | Markova et al. |
| 2008/0244218 A1 | 10/2008 | Dzierzon et al. |
| 2008/0276038 A1 | 11/2008 | Tanaka et al. |
| 2009/0037941 A1 | 2/2009 | Armstrong et al. |
| 2009/0113422 A1 | 4/2009 | Kani |
| 2009/0150639 A1 | 6/2009 | Ohata |
| 2009/0199190 A1 | 8/2009 | Chen et al. |
| 2009/0248957 A1* | 10/2009 | Tzeng ................ G06F 13/4239 711/E12.008 |
| 2010/0005217 A1 | 1/2010 | Jeddeloh |
| 2010/0011169 A1 | 1/2010 | Pothireddy |
| 2010/0011188 A1 | 1/2010 | Eddy et al. |
| 2010/0017632 A1 | 1/2010 | Cooper et al. |
| 2010/0017650 A1* | 1/2010 | Chin .................... G06F 11/108 710/22 |
| 2010/0082899 A1 | 4/2010 | Nakajima et al. |
| 2010/0281230 A1 | 11/2010 | Rabii et al. |
| 2010/0293325 A1* | 11/2010 | Maheshwari ...... G11C 11/40615 711/E12.007 |
| 2010/0293412 A1 | 11/2010 | Sakaguchi et al. |
| 2011/0161554 A1 | 6/2011 | Selinger et al. |
| 2011/0231857 A1 | 9/2011 | Zaroo et al. |
| 2011/0238887 A1 | 9/2011 | Bazzani |
| 2011/0238899 A1 | 9/2011 | Yano et al. |
| 2012/0041914 A1 | 2/2012 | Tirunagari |
| 2012/0047312 A1 | 2/2012 | Nathuji et al. |
| 2012/0054419 A1 | 3/2012 | Chen et al. |
| 2012/0079285 A1 | 3/2012 | Gueron et al. |
| 2012/0084497 A1 | 4/2012 | Subramaniam et al. |
| 2012/0117304 A1 | 5/2012 | Worthington et al. |
| 2012/0124572 A1 | 5/2012 | Cunningham et al. |
| 2012/0226850 A1 | 9/2012 | Nakanishi |
| 2012/0246403 A1 | 9/2012 | Mchale et al. |
| 2012/0297121 A1* | 11/2012 | Gorobets ............ G06F 12/0246 711/E12.008 |
| 2012/0297122 A1 | 11/2012 | Gorobets et al. |
| 2012/0323977 A1 | 12/2012 | Fortier et al. |
| 2013/0024609 A1* | 1/2013 | Gorobets ............. G06F 3/0611 711/E12.008 |
| 2013/0111113 A1* | 5/2013 | Harari ................. G06F 11/1068 711/103 |
| 2013/0124811 A1 | 5/2013 | Hamilton et al. |
| 2013/0145095 A1 | 6/2013 | McKean et al. |
| 2013/0151761 A1 | 6/2013 | Kim et al. |
| 2013/0152086 A1 | 6/2013 | Yoo et al. |
| 2013/0179632 A1 | 7/2013 | Ben-shemesh et al. |
| 2013/0219113 A1 | 8/2013 | Liebowitz et al. |
| 2013/0226837 A1 | 8/2013 | Lymberopoulos et al. |
| 2014/0006740 A1 | 1/2014 | Tokusho et al. |
| 2014/0032818 A1 | 1/2014 | Chang et al. |
| 2014/0040550 A1 | 2/2014 | Nale et al. |
| 2014/0089631 A1 | 3/2014 | King |
| 2014/0126274 A1* | 5/2014 | Lee .................... G06F 12/0804 365/154 |
| 2014/0164676 A1 | 6/2014 | Borchers et al. |
| 2014/0164677 A1 | 6/2014 | Borchers et al. |
| 2014/0208042 A1 | 7/2014 | Chinya et al. |
| 2014/0281168 A1 | 9/2014 | Koseki |
| 2014/0281311 A1 | 9/2014 | Walker et al. |
| 2015/0016046 A1 | 1/2015 | Shaeffer |
| 2015/0026509 A1 | 1/2015 | Zhang et al. |

(56) References Cited

U.S. PATENT DOCUMENTS

| | | |
|---|---|---|
| 2015/0032921 A1 | 1/2015 | Malkin |
| 2015/0067087 A1 | 3/2015 | Guerin et al. |
| 2015/0082062 A1 | 3/2015 | Saraswat et al. |
| 2015/0097851 A1 | 4/2015 | Anderson et al. |
| 2015/0106656 A1 | 4/2015 | Bian et al. |
| 2015/0134927 A1 | 5/2015 | Varanasi |
| 2015/0160858 A1 | 6/2015 | Okada et al. |
| 2015/0169238 A1 | 6/2015 | Lee et al. |
| 2015/0178013 A1 | 6/2015 | Rostoker et al. |
| 2015/0199276 A1 | 7/2015 | Radhakrishnan et al. |
| 2015/0212741 A1 | 7/2015 | Lee et al. |
| 2015/0227465 A1 | 8/2015 | Sundaram et al. |
| 2015/0268875 A1 | 9/2015 | Jeddeloh |
| 2015/0278091 A1 | 10/2015 | Wilkerson et al. |
| 2015/0356125 A1 | 12/2015 | Golander et al. |
| 2015/0378934 A1 | 12/2015 | Nathan et al. |
| 2016/0042005 A1 | 2/2016 | Liu et al. |
| 2016/0054922 A1 | 2/2016 | Awasthi et al. |
| 2016/0110291 A1 | 4/2016 | Gordon et al. |
| 2016/0125048 A1 | 5/2016 | Hamada |
| 2016/0152086 A1 | 6/2016 | Kawakita |
| 2016/0188218 A1 | 6/2016 | Gray et al. |
| 2016/0188700 A1 | 6/2016 | Kleinschnitz, Jr. et al. |
| 2016/0210167 A1 | 7/2016 | Bolic et al. |
| 2016/0210251 A1 | 7/2016 | Nale et al. |
| 2016/0210465 A1 | 7/2016 | Craske et al. |
| 2016/0212214 A1 | 7/2016 | Rahman et al. |
| 2016/0253263 A1 | 9/2016 | Takada |
| 2016/0283698 A1 | 9/2016 | Huang et al. |
| 2016/0294710 A1 | 10/2016 | Sreeramoju |
| 2016/0306557 A1 | 10/2016 | Koseki et al. |
| 2016/0328156 A1 | 11/2016 | Swarbrick et al. |
| 2016/0328334 A1 | 11/2016 | Mese et al. |
| 2016/0350194 A1* | 12/2016 | Mohan ............... G05B 23/0254 |
| 2016/0350236 A1 | 12/2016 | Tsirkin et al. |
| 2016/0371014 A1 | 12/2016 | Roberts |
| 2016/0371496 A1 | 12/2016 | Sell |
| 2017/0039164 A1 | 2/2017 | Ioannou et al. |
| 2017/0060754 A1 | 3/2017 | Nakra et al. |
| 2017/0060769 A1 | 3/2017 | Wires et al. |
| 2017/0123796 A1 | 5/2017 | Kumar et al. |
| 2017/0131902 A1 | 5/2017 | Goss et al. |
| 2017/0147427 A1 | 5/2017 | Nero |
| 2017/0177486 A1 | 6/2017 | Horn |
| 2017/0185523 A1* | 6/2017 | Trika ..................... G06F 3/0685 |
| 2017/0187621 A1 | 6/2017 | Shalev et al. |
| 2017/0199666 A1 | 7/2017 | Sundaram et al. |
| 2017/0249266 A1 | 8/2017 | Nale et al. |
| 2017/0255383 A1 | 9/2017 | Chang et al. |
| 2017/0262215 A1 | 9/2017 | Banerjee et al. |
| 2017/0285967 A1 | 10/2017 | Pandurangan et al. |
| 2017/0285992 A1 | 10/2017 | Vogt |
| 2017/0302734 A1 | 10/2017 | Liang et al. |
| 2017/0316321 A1 | 11/2017 | Whitney et al. |
| 2017/0364422 A1 | 12/2017 | Antony et al. |
| 2017/0364450 A1 | 12/2017 | Struttmann |
| 2018/0001790 A1 | 1/2018 | Erbacher et al. |
| 2018/0004441 A1 | 1/2018 | Takamura et al. |
| 2018/0011790 A1 | 1/2018 | Gaur et al. |
| 2018/0018379 A1 | 1/2018 | Eda et al. |
| 2018/0024853 A1 | 1/2018 | Warfield et al. |
| 2018/0046581 A1 | 2/2018 | Banerjee et al. |
| 2018/0059976 A1 | 3/2018 | Helmick et al. |
| 2018/0089087 A1 | 3/2018 | Chang et al. |
| 2018/0089562 A1* | 3/2018 | Jin ........................ G06F 7/5443 |
| 2018/0121366 A1 | 5/2018 | Tian |
| 2018/0150219 A1 | 5/2018 | Chen et al. |
| 2018/0189207 A1 | 7/2018 | Nale et al. |
| 2018/0260135 A1* | 9/2018 | Hayashida .......... G06F 13/1673 |
| 2018/0293163 A1 | 10/2018 | Bergeron |
| 2018/0316569 A1 | 11/2018 | Cilfone et al. |
| 2018/0332366 A1 | 11/2018 | Paduroiu |
| 2019/0004841 A1 | 1/2019 | Starks |
| 2019/0018809 A1 | 1/2019 | Nale et al. |
| 2019/0026030 A1* | 1/2019 | Yang ..................... G06F 3/0649 |
| 2019/0034284 A1 | 1/2019 | Mohanta et al. |
| 2019/0079689 A1 | 3/2019 | Cherubini et al. |
| 2019/0129834 A1 | 5/2019 | Purkayastha et al. |
| 2019/0129847 A1 | 5/2019 | Roh |
| 2019/0179760 A1 | 6/2019 | Bhargava et al. |
| 2019/0196996 A1 | 6/2019 | Balakrishnan et al. |
| 2019/0243552 A1 | 8/2019 | Maharana et al. |
| 2019/0243570 A1 | 8/2019 | Mittal et al. |
| 2019/0243756 A1 | 8/2019 | Ray et al. |
| 2019/0243771 A1 | 8/2019 | Mittal et al. |
| 2019/0253520 A1 | 8/2019 | Maharana et al. |
| 2019/0303283 A1 | 10/2019 | Mcglaughlin et al. |
| 2019/0310780 A1 | 10/2019 | Gholamipour et al. |
| 2019/0332556 A1 | 10/2019 | Nale et al. |
| 2019/0334801 A1* | 10/2019 | Dutta ..................... H04L 43/16 |
| 2019/0370043 A1 | 12/2019 | Olderdissen |
| 2020/0019506 A1 | 1/2020 | Ray et al. |
| 2020/0073827 A1 | 3/2020 | Wallach |
| 2020/0074094 A1 | 3/2020 | Wallach |
| 2020/0319813 A1 | 10/2020 | Mittal et al. |
| 2020/0326851 A1 | 10/2020 | Frolikov et al. |
| 2021/0034524 A1 | 2/2021 | Leidel et al. |
| 2021/0048947 A1 | 2/2021 | Frolikov et al. |
| 2021/0117326 A1 | 4/2021 | Ray et al. |
| 2021/0120099 A1 | 4/2021 | Maharana et al. |
| 2021/0349638 A1 | 11/2021 | Maharana et al. |
| 2022/0326868 A1 | 10/2022 | Mittal et al. |
| 2022/0398194 A1 | 12/2022 | Ray et al. |
| 2023/0362280 A1 | 11/2023 | Maharana et al. |
| 2023/0393743 A1 | 12/2023 | Frolikov et al. |

FOREIGN PATENT DOCUMENTS

| | | |
|---|---|---|
| KR | 20140041408 | 4/2014 |
| KR | 20160116533 A | 10/2016 |

OTHER PUBLICATIONS

Analyzing Intel-Micron 3D XPoint: The NextGeneration Non-Volatile Memory by Vatto (Year: 2015).*

How PCI Express Works by Wilson (Year: 2017).*

SSD controllers integrate DDR4 DRAM on chip by Kalnoskas (Year: 2016).*

The SSD Guy Objective Analysis, on SSDs Where does NVRAM Fit? by Jim Handy (Year: 2014).*

Intel PCI-SIG Single Root I/O Virtualization (SR-IOV) Support in Intel® Virtualization Technology for Connectivity (Year: 2008).*

A. Romanow, J. Mogul, T. Talpey, S. Bailey, "Remote Direct Memory Access (RDMA) over IP Problem Statement", RFC 4297, Dec. 2005 (https://www.rfc-editor.org/search/rfc_search_detail.php).

International Search Report and Written Opinion, PCT/US2019/013841, Apr. 23, 2019.

International Search Report and Written Opinion, PCT/US2019/013836, Apr. 22, 2019.

"Solid-State Drive", Wikipedia, printed on Mar. 14, 2018.

"Write combining," Wikipedia encyclopedia entry located at https://en.wikipedia.org/wiki/Write_combining, Feb. 12, 2018.

Demand paging, Wikipedia, printed on Apr. 18, 2018.

Device driver, Wikipedia, printed on Apr. 19, 2018.

Garbage collection (computer science), Wikipedia, printed on Sep. 26, 2018.

Graphics processing unit, Wikipedia, printed on Jul. 26, 2018.

Hypervisor, Wikipedia, printed on Apr. 19, 2018.

InfiniBand, Wikipedia, printed on Jul. 26, 2018.

Integrated circuit, Wikipedia, printed on Sep. 24, 2018.

Interlaken (networking), Wikipedia, printed on Sep. 21, 2018.

Message Passing Interface, Wikipedia, printed on Jul. 26, 2018.

Microsequencer, Wikipedia, printed on Sep. 21, 2018.

Operating system, Wikipedia, printed on Apr. 18, 2018.

PCI Express, Wikipedia, printed on Sep. 21, 2018.

Page cache, Wikipedia, printed on Apr. 18, 2018.

Page replacement algorithm, Wikipedia, printed on Jul. 31, 2018.

Page table, Wikipedia, printed on Jul. 31, 2018.

Paging, Wikipedia, printed on Apr. 18, 2018.

(56) References Cited

OTHER PUBLICATIONS

RAM drive, Wikipedia, printed on Apr. 18, 2018.
SerDes, Wikipedia, printed on Sep. 21, 2018.
Switched fabric, Wikipedia, printed on Jul. 26, 2018.
Translation lookaside buffer, Wikipedia, printed on Apr. 18, 2018.
Virtual memory, Wikipedia, printed on Apr. 18, 2018.
Mmap, Wikipedia, printed on Apr. 18, 2018.
International Search Report, PCT/US2019/040413, mailed Oct. 25, 2019.
Jeff Hawkins et al., "Sequence memory for prediction, inference and behaviour", In: Philosophical Transactions of the Royal Society B: Biological Sciences, pp. 1203-1209, May 1, 2009.
Oracle, "NFS Over ROMA", Retrieved on Feb. 18, 2020 from https://web.archive.org/web/20150920225910/https://docs.oracle.com/cd/E23824_01/html/821-1454/rfsrefer-154.html# (Year: 2015).
International Search Report and Written Opinion, PCT/US2019/014275, mailed May 8, 2019.
International Search Report and Written Opinion, PCT/US2019/015602, mailed May 3, 2019.
International Search Report and Written Opinion, PCT/US2019/014205, mailed May 1, 2019.
International Search Report and Written Opinion, PCT/US2019/014285, mailed May 8, 2019.
Title: Predictive Data Orchestration in Multi-Tier Memory Systems, U.S. Appl. No. 16/054,819, filed Aug. 3, 2018, Inventors: Samir Mittal et al., Status: Patented Case, Status Date: Sep. 2, 2020.
Title: Predictive Data Orchestration in Multi-Tier Memory Systems, U.S. Appl. No. 16/905,834, filed Jun. 18, 2020, Inventors: Samir Mittal et al., Status: Docketed New Case—Ready for Examination, Status Date: Sep. 25, 2020.
Title: Accelerate Data Access in Memory Systems Via Data Stream Segregation, U.S. Appl. No. 16/166,624, filed Oct. 22, 2018, Inventors: Samir Mittal et al., Status: Final Rejection Mailed, Status Date: Jul. 1, 2020.
Title: Memory Virtualization for Accessing Heterogeneous Memory Components, U.S. Appl. No. 16/054,719, filed Aug. 3, 2018, Inventors: Anirban Ray et al., Status: Final Rejection Mailed, Status Date: Nov. 10, 2020.
Title: Remote Direct Memory Access in Multi-Tier Memory Systems, U.S. Appl. No. 16/107,624, filed Aug. 21, 2018, Inventors: Parag Maharana et al., Status: Non-Final Action Mailed, Status Date: Feb. 21, 2020.
Title: Optimization of Data Access and Communication in Memory Systems, U.S. Appl. No. 16/183,234, filed Nov. 7, 2018, Inventors: Parag Maharana et al., Status: Notice of Allowance Mailed—Application Received in Office of Publications, Status Date: Aug. 25, 2020.
Title: Predictive Data Pre-Fetching in a Data Storage Device, U.S. Appl. No. 16/384,618, filed Apr. 15, 2019, Inventors: Alex Frolikov et al., Status: Notice of Allowance Mailed—Application Received in Office of Publications, Status Date: Jul. 23, 2020.
Title: Predictive Data Pre-Fetching in a Data Storage Device, U.S. Appl. No. 17/088,360, filed Nov. 3, 2020, Inventors: Alex Frolikov et al., Status: Application Undergoing Preexam Processing, Status Date: Nov. 3, 2020.
Title: Predictive Paging to Accelerate Memory Access, U.S. Appl. No. 16/032,331, filed Jul. 11, 2018, Inventors: Anirban Ray et al., Status: Notice of Allowance Mailed—Application Received in Office of Publications, Status Date: Aug. 21, 2020.
International Search Report and Written Opinion, PCT/US2020/021825, mailed Jul. 6, 2020.
Abhijith, et al. "The Efficient Use of Storage Resources in SAN for Storage Tiering and Caching," 2015 International Conference on Computational Intelligence and Networks, IEEE, Jan. 11, 2016.
Extended European Search Report, EP19746836.6, mailed on May 19, 2021.
Extended European Search Report, EP19748086.6, mailed on Jun. 8, 2021.
Extended European Search Report, EP19746972.9, mailed on May 19, 2021.
Jacob, et al. "Optimized utilization of disks in storage area network by storage tiering," 2017 International Conference on Computing, Communication, and Automation 9ICCCA), IEEE, May 5, 2017.
Salkhordeh, et al. "Operating system level data tiering using online workload characterization," Journal of Supercomputing, Kluwer Academic Publishers, Jan. 31, 2015.
Extended European Search Report, EP19747107.1, mailed on Apr. 30, 2021.
Extended European Search Report, EP19746665.9, mailed on May 3, 2021.
Extended European Search Report, EP19833924.4, mailed on Mar. 18, 2022.
Palmer, Mark, et al. "Fido: A Cache That Learns to Fetch." Proceedings of the 17th International Conference on Very Large Data Bases, Sep. 1991.
Ppeled, Leeor, et al. "A neural network memory prefetcher using semantic locality." arXiv:1804.00478v2, Jul. 26, 2018.
Salkhordeh, Reza, et al., "Operating System Level Data Tiering Using Online Workload Characterization." Journal of Supercomputing, vol. 71 No. 4, Jan. 31, 2015.
Oracle Solaris Administration, "NFS Over RDMA." Retrieved from the Internet <https://web.archive.org/web/20150920225910/https://docs.oracle.com/cd/E23824_01/html/821-1454/rfsrefer-154.html#> on Mar. 9, 2023.
Salkhordeh, Reza, et al., "Operating system level data tiering using online workload characterization." Springer Science + Business Media, 2015.
Cong, Ming, et al., "Reducing Memory-access Latency of Block Execution Model Through Data Prefetching." Small Micro Computer Systems, Journal of Chinese Computer Systems, vol. 31, No. 8, Aug. 8, 2010.
Wikipedia, "Bus (Computing)." Retrieved from the Internet on Oct. 9, 2023 <https://web.archive.org/web/20171017155753/https://en.wikipedia.org/wiki/Bus_(computing)>, XP093089868, Oct. 17, 2017.
Wikipedia, "Bus (Computing)." Retrieved from the Internet on Oct. 9, 2023 <https://web.archive.org/web/20230912161527/https://en.wikipedia.org/wiki/Bus_(computing)>, XP093089872, Sep. 12, 2023.
Anonymous, "Cache Replacement Policies." XP093186361, <https://en.wikipedia.org/w/index.php?title=cache_replacement_policies&oldid=820802062> Retrieved from the Internet on Jul. 17, 2024.
Extended European Search Report, EP24179216, mailed on Jul. 30, 2024.

* cited by examiner

MEMORY SYSTEMS HAVING CONTROLLERS EMBEDDED IN PACKAGES OF INTEGRATED CIRCUIT MEMORY

RELATED APPLICATIONS

The present application claims the benefit of the filing date of Prov. U.S. Pat. App. Ser. No. 62/626,527, filed on Feb. 5, 2018 and entitled "Architecture for Storage Devices using Embedded Media Controllers," the entire disclosure of which is hereby incorporated herein by reference.

FIELD OF THE TECHNOLOGY

At least some embodiments disclosed herein relate to memory systems in general, and more particularly, but not limited to memory systems having controllers embedded in packages of integrated circuit (IC) memory.

BACKGROUND

A memory sub-system can be a memory module, such as a dual in-line memory module (DIMM), a small outline DIMM (SO-DIMM), or a non-volatile dual in-line memory module (NVDIMM). A memory sub-system can be a storage system, such as a solid-state drive (SSD), or a hard disk drive (HDD). A memory sub-system can include one or more memory components that store data. The memory components can be, for example, non-volatile memory components and volatile memory components. Examples of memory components include memory integrated circuits (ICs). Some memory integrated circuits are volatile and require power to maintain stored data. Some memory integrated circuits are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Examples of volatile memory include Dynamic Random-Access Memory (DRAM) and Static Random-Access Memory (SRAM). In general, a host system can utilize a memory sub-system to store data at the memory components and to retrieve data from the memory components.

For example, a computer can include a host system and one or more memory sub-systems attached to the host system. The host system can have a central processing unit (CPU) in communication with the one or more memory sub-systems to store and/or retrieve data and instructions. Instructions for a computer can include operating systems, device drivers, and application programs. An operating system manages resources in the computer and provides common services for application programs, such as memory allocation and time sharing of the resources. A device driver operates or controls a particular type of devices in the computer; and the operating system uses the device driver to offer resources and/or services provided by the type of devices. A central processing unit (CPU) of a computer system can run an operating system and device drivers to provide the services and/or resources to application programs. The central processing unit (CPU) can run an application program that uses the services and/or resources. For example, an application program implementing a type of applications of computer systems can instruct the central processing unit (CPU) to store data in the memory components of a memory sub-system and retrieve data from the memory components.

An operating system of a computer system can allow an application program to use virtual addresses of memory to store data in, or retrieve data from, memory components of one or more memory sub-systems of the computer system. The operating system maps the virtual addresses to physical addresses of one or more memory sub-systems connected to the central processing unit (CPU) of the computer system. The operating system implements the memory accesses specified at virtual addresses using the physical addresses of the memory sub-systems.

A virtual address space can be divided into pages. A page of virtual memory can be mapped to a page of physical memory in the memory sub-systems. The operating system can use a paging technique to access a page of memory in a storage device via a page of memory in a memory module. At different time instances, the same page of memory in a memory module can be used as proxy to access different pages of memory in the storage device or another storage device in the computer system.

A computer system can include a hypervisor (or virtual machine monitor) to create or provision virtual machines. A virtual machine is a computing device that is virtually implemented using the resources and services available in the computer system. The hypervisor presents the virtual machine to an operating system as if the components of virtual machine were dedicated physical components. A guest operating system runs in the virtual machine to manage resources and services available in the virtual machine, in a way similar to the host operating system running in the computer system. The hypervisor allows multiple virtual machines to share the resources of the computer system and allows the virtual machines to operate on the computer substantially independently from each other.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to a memory sub-system having embedded media controllers within the packages of integrated circuit (IC) memory. A memory sub-system is also hereinafter referred to as a "memory device." An example of a memory sub-system is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory sub-system is a storage device that is connected to the central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). In some embodiments, the memory sub-system is a hybrid memory/storage sub-system that provides both memory functions and storage functions. In general, a host system can utilize a memory sub-system that includes one or more memory components. The host system can provide data to be stored at the memory sub-system and can request data to be retrieved from the memory sub-system.

A conventional solid-state drive uses a controller to manage the operations of memory that is implemented in the form of integrated circuits (ICs). A predetermined communication structure between the controller and integrated circuit memory packages limits the scalability of such memory sub-systems.

At least some aspects of the present disclosure address the above and other deficiencies by embedding media controllers in packages of integrated circuit memory. Each embedded media controller can be configured to have a serial communication interface for communicating with an external controller using a serial communication connection. When more packages of integrated circuit memory are added to the memory sub-system to increase memory capacity, more parallel serial communication connections can be added between the external controller and the pool of memory implemented via the integrated circuit memory encapsulated in the IC packages. Thus, the communication bandwidth between the external controller and the pool of memory can increase as the memory capability of the memory sub-system is scaled up. The media controllers allow the external controller to implement advanced functionalities, such as data stream segregation, wear leveling across the entire pool of memory, and/or a distributed flash translation layer operation across the pool of memory (e.g., logical to physical address mapping, garbage collection, etc.).

Figure 1:
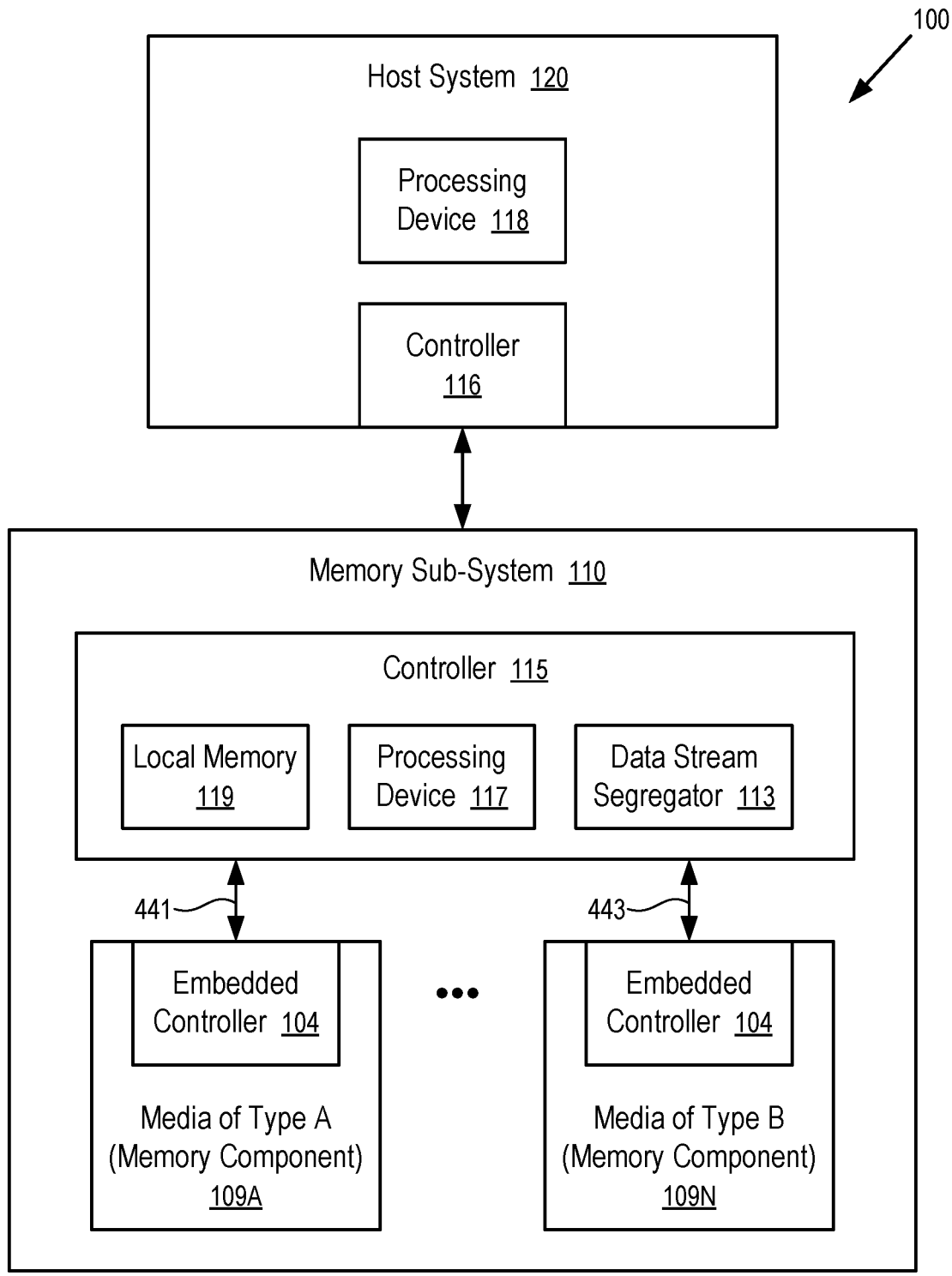
FIG. 1 illustrates an example computing system having a memory sub-system in accordance with some embodiments of the present disclosure.

FIG. 1 illustrates an example computing system 100 having a memory sub-system 110 in accordance with some embodiments of the present disclosure. The memory sub-system 110 can include media, such as memory components 109A to 109N. The memory components 109A to 109N can be volatile memory components, non-volatile memory components, or a combination of such. In some embodiments, the memory sub-system 110 is a memory module. Examples of a memory module includes a DIMM, NVDIMM, and NVDIMM-P. In some embodiments, the memory sub-system is a storage system. An example of a storage system is an SSD. In some embodiments, the memory sub-system 110 is a hybrid memory/storage sub-system. In general, the computing environment can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, etc. The physical host interface can be used to transmit data between the host system 120 and the memory sub-system 110. The host system 120 can further utilize an NVM Express (NVMe) interface to access the memory components 109A to 109N when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The host system 120 includes a processing device 118 and a controller 116. The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110.

In general, the controller 116 can send commands or requests to the memory sub-system 110 for desired access to memory components 109A to 109N. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory components 109A to 109N and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory components 109A to 109N can include any combination of the different types of non-volatile memory components and/or volatile memory components. An example of non-volatile memory components includes a negative-and (NAND) type flash memory. Each of the memory components 109A to 109N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and an MLC portion of memory cells. Each of the memory cells can store one or more bits of data (e.g., data blocks) used by the host system 120. Although non-volatile memory components such as NAND type flash memory are described, the memory components 109A to 109N can be based on any other type of memory such as a volatile memory. In some embodiments, the memory components 109A to 109N can be, but are not limited to, random access memory (RAM), read-only memory (ROM), dynamic random access memory (DRAM), synchronous dynamic random access memory (SDRAM), phase change memory (PCM), magneto random access memory (MRAM), Spin Transfer Torque (STT)-MRAM, ferroelectric random-access memory (FeTRAM), ferroelectric RAM (FeRAM), conductive bridging RAM (CBRAM), resistive random access memory (RRAM), oxide based RRAM (OxRAM), negative-or (NOR) flash memory, electrically erasable programmable read-only memory (EEPROM), nanowire-based non-volatile memory, memory that incorporates memristor technology, and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 109A to 109N can be grouped as memory pages or data blocks that can refer to a unit of the memory component used to store data.

The controller 115 of the memory sub-system 110 can communicate with the memory components 109A to 109N to perform operations such as reading data, writing data, or erasing data at the memory components 109A to 109N and other such operations (e.g., in response to commands scheduled on a command bus by controller 116). The controller 115 can include hardware such as one or more integrated circuits (ICs) and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processing device 117 (processor) configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 109A to 109N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 109A to 109N. The controller 115 can further include host interface circuitry to communicate with the host system 120 via the physical host interface. The host interface circuitry can convert the commands received from the host system into command instructions to access the memory components 109A to 109N as well as convert responses associated with the memory components 109A to 109N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 109A to 109N.

The memory components 109A, ..., 119N can have embedded controllers 104 that communicate with the controller 115 through separate communication connections 441, ..., 443. The separate connections 441, ..., 443 between the memory components 109A, ..., 119N and the controller 115 can operate in parallel and thus increase the communication bandwidth between the memory components 109A, ..., 119N as a whole and the controller 115.

For example, each embedded controller 104 can communicate with the controller 115 via a serial connection 441, ..., or 443. The serial connection 441, ..., or 443 can operate in accordance with a predefined communication standard. For example, the serial connection 441, ..., or 443 can be in accordance with the standard of peripheral component interconnect express (PCIe), serial advanced technology attachment (SATA), universal serial bus (USB), or Interlaken, etc.

Figure 2:
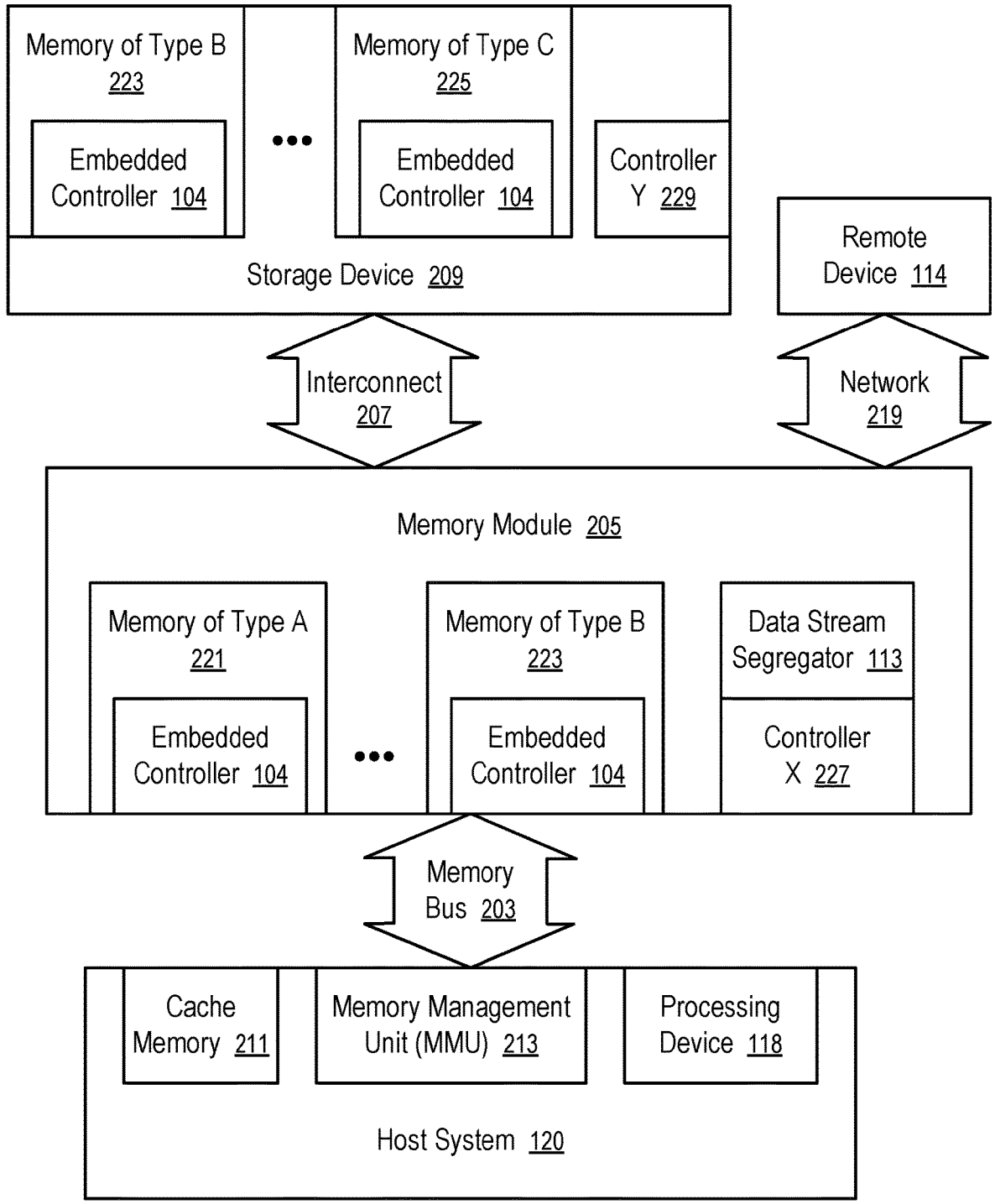
FIG. 2 shows a computing system having embedded controllers in different tiers of memory and a data stream segregator to accelerate data access in accordance with at least some embodiments disclosed herein.

The controller 115 can be optionally implemented via a hierarchy of connected controllers (e.g., as illustrated in FIG. 2) that are connected via a network of serial connections and/or serial buses. For example, at a bottom layer of the hierarchy implementing the controller 115, a set of controllers can have parallel serial connections 441, ..., 443 to the embedded controllers 104 respectively.

The controller 115 can include a data stream segregator 113 that can generate, from a stream of data access requests from the host system 120, separate data streams suitable for the memory components 109A to 109N according to their performance characteristics to improve the data access speed of the computer system as a whole. In some embodiments, the controller 115 in the memory sub-system 110 includes at least a portion of the data stream segregator 113. In other embodiments, or in combination, the controller 116 and/or the processing device 118 in the host system 120 includes at least a portion of the data stream segregator 113. For example, the controller 115, the controller 116, and/or the processing device 118 can include logic circuitry implementing the data stream segregator 113. For example, the controller 115, or the processing device 118 (processor) of the host system 120, can be configured to execute instructions stored in memory for performing the operations of the data stream segregator 113 described herein. In some embodiments, the data stream segregator 113 is implemented in an integrated circuit chip disposed in the memory sub-system 110. In other embodiments, the data stream segregator 113 can be part of an operating system of the host system 120, a device driver, or an application.

The data stream segregator 113 can reorganize and service the data access requests from the host system 120. The mixed data stream between the host system 120 and the data stream segregator 113 can be separated into different data streams targeting the memory components 109A to 109N of different types. For example, data with frequent random access can be relocated to and/or cached in a fast memory component (e.g., 109A); and data with infrequent sequential access can be operated upon in a slow memory component (e.g., 109N) without going through the fast memory component. The data stream segregation can be performed based on the recent data access pattern and/or based on predicted data usages and data movements across different tiers of memories, such as faster memory (e.g., 109A) and slower memory (e.g., 109N). Applications may access certain data in sequences; and certain objects may be used together. Thus, the use of a data item in a user account, in an application, in a virtual machine, as part of an object, can be indication of the subsequent use of another related data item. The data stream segregator 113 can instruct the controller 115 to rearrange the physical storage locations of the data items in the memory sub-system 110, such that different data streams can be directed to the respective physical storage locations respectively for improved overall performance. The data stream segregator 113 can optionally use an artificial neural network to predict data usages and/or movements in data segregation; and the artificial neural network can be initially trained offline using historic data access records and then continuously trained in real time usage using the real time data access records. Further details with regards to the operations of the data stream segregator 113 are described below.

For example, from the mixed stream of write requests from the host system 120, the data stream segregator 113 can identify a stream of sequential write operations. For example, the addresses of the write operations can be in a logical address space that can be further translated into a physical address space for operating on memory units identified by the addresses. When the write operations specify addresses that are sequential in the logical address space, the data stream segregator 113 can allocate a set of contiguous physical memory to store the data sequentially.

For example, the data stream segregator 113 can map the physical storage location of the data to a slow memory (e.g., 109N) where the completion of the write operations does not have direct impact on the performance of the host system 120.

For example, from the mixed stream of write requests from the host system 120, the data stream segregator 113 can identify a stream of random write operations, where the data is also used frequently. The data stream segregator 113 can map the physical storage location of the data to a fast memory (e.g., 109A) such that the data access time can be reduced for the host system 120. When the computation activities in the host system 120 changes such that the data is no longer used frequently, the data stream segregator 113 can remap the physical storage location of the data to a slow memory (e.g., 109N) and thus allow the portion of the faster memory (e.g., 109A) previously used for the data to be freed for use by other data that is is used frequently in a most recent time period (or predicted to be used frequently in a subsequent time period).

For example, from the mixed stream of write requests from the host system 120, the data stream segregator 113 can identify a stream of random write operations, cache the data in the fast memory (e.g., 109A) for coalescing and/or serialization, and generate sequential write operations to store the data into the slow memory (e.g., 109N). The storing of the data into the slow memory (e.g., 109N) can be performed according to a frequency designed to improve longevity of the slow memory (e.g., 109N), when the slow memory has a limited endurance for repeated write/erasure operations.

The data stream segregator 113 can identify and classify groups of data based on their usage frequencies. For example, data accessed at a frequency above a first threshold can be classified as hot data and configured to be stored in a top tier memory (e.g., 109A) that has the fastest access speed. Data accessed at a frequency below a second threshold can be classified as cold data and configured to be stored in a bottom tier memory (e.g., 109N) that has the slowest access speed. Data accessed at a frequency between the first and second thresholds can be classified as warm data and configured to be stored in a middle tier memory that is slower than the top tier but faster than the lower tier. For example, the top tier can be implemented using DRAM or cross point memory that can support high performance random access without endurance issues for repeated write/erasure operations; the middle tier can be implemented using single level cell (SLC) NAND flash memory; and the third tier can be implemented using triple level cell (TLC) or quad-level cell (QLC) NAND flash memory. SLC flash memory can be less expensive than DRAM or cross point memory but more expensive than TLC or QLC flash memory; and SLC flash memory can have better performance and less endurance issues than TLC or QLC flash memory. The data stream segregation can allow the access performance of the memory system as a whole to be improved to approach the performance of the top or middle tier memory, while reducing the cost to that of the bottom tier memory.

In some instances, the top tier memory is a combination of DRAM and cross point memory where the content in the DRAM can be stored in the cross point memory in the event of power failure. Thus, the combination of DRAM and the cross point memory can function as a non-volatile memory.

The data stream segregator 113 can be configured to separate the data stream based on not only the usage frequencies, but also the workload hints and/or tags that identify various attributes of the data streams, such as whether the data access is streaming, whether the data access is sequential or random, whether the workload is synchronous or concurrent, quality of service (QoS) priority of data access, whether the data access is read or write, the input/output size, atomicity, volatility, access pattern, etc. Based on the data workload hints and/or tags, the controller 115 determines the locality of the accessed data, the data placement in the memory subsystem 110 (e.g., based on data access frequency), perform tiered data caching within the memory sub-system 110, construct non-blocking write streams, etc.

The workload hints and/or tags can be provided via a device driver of the memory sub-system 110 running in the host system 120. Some details and examples of the device drive can be found in U.S. patent application Ser. No.

16/054,719, filed Aug. 3, 2018 and entitled "Memory Virtualization for Accessing Heterogeneous Memory Components."

Optionally, the write access to the memory tier implemented using TCL/QLC NAND memory can be initially cached in the top tier memory for conversion to write streams with defined attributes that are customized according to the endurance of the memory and desired access/change frequency of the memory. Using the top tier to cache and reorganize the write stream can reduce write amplification, eliminate blocking/delaying of read operations caused by the write operations, allowing prioritization of read operations over write operations, and allowing joint optimization of memory media capability to workload requirements. Streaming sequential write operations to TCL/QLC NAND memory can reduce or eliminate fragmentation in memory.

The data stream segregator 113 can identify a data stream based on various characterizations to enable make intelligent decisions regarding management of the sequence, timing and/or location of data storage in the memory system. For example, the data stream is identified and organized as being suitable for a type of memory, among different types of memory having different latency for read and write access and/or endurance for data access.

The incoming data stream from the host system 120 can contains information (e.g., tags, attributes, hints) about the data, indicating intended, anticipated, or expected future use of the data. For example, the information or hints may include metadata or attributes tags, QoS (quality of service) parameters, priority parameters, etc. The controller can prioritize the data destination according to storage media capability and characteristics of the data streams.

In general, the separation of data into different categories or streams can be done based on characteristics and/or other information that is provided by, collected, or requested from the host system 120 regarding the nature of the data (e.g., streaming, sequential versus random, type of workload, and/or other data attributes that can be used to predict the future performance needs for the data).

In one example, the data stream segregator 113 have at least two sets of memory provided in one or more memory systems under the control of the controller 115. For example, one set of memory can be slower than the other set of memory. The controller 115 presents the capacity of the two sets of memory to the CPU, as if there were a single set of uniform memory in the memory sub-system 110. The controller 115 and/or the data stream segregator 113 can shield the differences in the sets of memory from the host system 120. For example, the controller 115 can remap the memory address used by the host system 120 to address a memory unit in the memory sub-system 110 to a physical address in a memory component (e.g., 109A or 109N); and the mapping can be adjusted to allow the data to be physically hosted at a location suitable for a current data stream identified by the data stream segregator 113.

Optionally, a faster memory (e.g., 109A) can be used as a cache of a slower memory (e.g., 109B), the data stored in the faster memory has a corresponding copy in the slower memory. When the faster memory is changed, the corresponding copy in the slower memory becomes out of date. The changed content in the faster memory is to be flushed to the slower memory for update.

Alternatively, the content in the slower memory can be accessed without going through the faster memory in some instances; and the content in the faster memory may not have a corresponding copy in the slower memory. The distribution of the content in the slower memory and the faster memory can be dynamically changed to optimize the operating performance for the current workload. In such a situation, the faster memory can still be considered as a cache for the purpose of tracking cache hit ratio. For example, if a data item being accessed is serviced from the faster memory, a cache hit is counted; and if a data item being accessed is serviced from the slower memory, a cache miss is counted. Thus, cache hit ratio can be tracked for performance monitoring and/or data usage prediction even when the faster memory is not configured as the cache of the slower memory.

In some instances, a memory virtualizer can be implemented in a device driver of a memory component to virtualize memory access to the memories of different tiers to shield the differences in the memory components 109A to 109N from applications and/or virtual machines. The memory virtualizer automatically adjusts data storage locations across the memories of different tiers to optimize the performance of the computing system. Some details and examples of memory virtualizers can be found in U.S. patent application Ser. No. 16/054,719, filed Aug. 3, 2018 and entitled "Memory Virtualization for Accessing Heterogeneous Memory Components."

When a data item being accessed is in the slower set of memory but not in the faster set of memory, the data item can be accessed in the slower set of memory directly, or swapped to the faster set of memory for accessing in the faster set of memory, or cached in the faster set of memory. If the workload of accessing the data item is predicted by the data stream segregator 113, the data stream segregator 113 instructs the controller 115 to swap the data item to the faster set of memory, or cache the data item in the faster set of memory, before the data access. After the data movement performed in accordance with workload prediction, the data access can be served from the faster set of memory when the data item is accessed. Since the data access is serviced from the faster set of memory, the time to complete the data access is shorter than servicing from the slower set of memory, or swapping to the faster set of memory for servicing, or loading the data from the slower set of memory to the faster set of memory for caching and then servicing.

For example, when a page of virtual memory being accessed is currently in the slower set of memory but not in the faster set of memory, a page can be allocated from the faster set of memory to service the page in the slower set of memory; and the data of the page can be fetched from the slower set of memory and stored in the allocated page in the faster set of memory, such that the data access of the page of the virtual memory can be made via accessing the allocated page in the faster set of memory in subsequent operations.

In some instances, swapping a page takes a time longer than simply access a requested data element from the slower memory. Thus, the requested data element is first serviced to the requester, while the page swapping is performed to speed up subsequent access to the data elements in the hot page. Thus, the overall performance is better than holding the request for the data element until the page swap is completed.

Further, information related to the use of the pages in the slower set of memory can be used to train a self-learning prediction engine in predicting the use of the pages. For example, a supervised machine learning technique can be used to train, using the information, an artificial neural network to predict the use of the pages in the slower set of memory by reducing the errors between predictions and the actual use of the pages. After the training of the artificial neural network, the prediction engine can use the current information to predict the next pages to be used. Further, the training, prediction, and feedback from the actual usage following the prediction for further training can be performed in a continuous fashion to adapt the prediction model of the artificial neural network to the most recent usage patterns of memory pages.

In response to the memory usage prediction that a page in the slower set of memory is to be used soon, the data stream segregator 113 can instruct the controller 115 to proactively swap or cache the page of data from the slower set of memory to the faster set of memory, such that when needed for processing, the page of data is already in the faster set of memory, which arrangement improves the data access speed of the page of data.

The accuracy of the prediction can be measured against the subsequent actual page use; and the prediction and the subsequent actual page use can be used to further train or adjust the artificial neural network to track the most recent usage patterns of memory pages.

Alternatively, or in combination, the machine learning-based prediction can be replaced or augmented with policy based prediction rules. For example, pages storing resident codes (e.g., in lower addresses) can be maintained in the faster set of memory when possible to reduce swapping of frequently used pages. For example, a huge page can be loaded into the faster set of memory when a page that is a portion of the huge page is being accessed. For example, predictions can be made at least in part using heuristic rules, based on indications such as whether the pages are accessed sequentially or randomly, whether the data access is in a steady state mode or in a bursty mode, and/or the logical relations between pages (and pages of different sizes).

Some details and examples regarding the prediction techniques can be found in U.S. patent application Ser. No. 16/032,331, filed Jul. 11, 2018 and entitled "Predictive Paging to Accelerate Memory Access."

FIG. 2 shows a computing system having embedded controllers 104 in different tiers of memory and a data stream segregator 113 to accelerate data access in accordance with at least some embodiments disclosed herein.

The computing system of FIG. 2 includes a host system 120, a memory module 205 connected to the host system 120 via a memory bus 203, and a storage device 209 connected to the memory module 205 via a interconnect 207. Optionally, the memory module 205 has a connection to a computer network 219 to perform remote direct data access (RDMA) operations to service the data on a remote device 114 through the memory module 205. The memory module 205 is an example of the memory sub-system 110 illustrated in FIG. 1. The remote device 114 can have a storage device similar to the local storage device 209 and/or a memory module similar to the local memory module 205. Some details and examples regarding remote direct memory access (RDMA) can be found in U.S. patent application Ser. No. 16/107,624, filed Aug. 21, 2018 and entitled "Remote Direct Memory Access in Multi-Tier Memory Systems."

The host system 120 has a processing device 118, which can be a central processing unit or a microprocessor with one or more processing cores. The host system 120 can have a memory management unit 213 and cache memory 211. The memory management unit 213 and/or at least a portion of the cache memory 211 can be optionally integrated within the same integrated circuit package of the processing device 118.

The memory module 205 illustrated in FIG. 2 can have multiple types of memory (e.g., 221 and 223). For example, memory of type A 221 is faster than memory of type B 223.

For example, the memory bus 203 can be a double data rate bus; and the interconnect 207 can be a peripheral component interconnect express (PCIe) bus, a serial advanced technology attachment (SATA) bus, a universal serial bus (USB) bus, and/or a storage area network. Memory of type B 223 in the memory module 205 can be accessed at a speed faster than accessing memory of type B 223 in the storage device 209.

The storage device 209 illustrated in FIG. 2 has multiple types of memory (e.g., 223 and 225). For example, memory of type B 223 is faster than memory of type C 225.

In FIG. 2, the memory components (e.g., 221, . . . , 223, . . . , 225) have media controllers 104 that are embedded within their packages of integrated circuit memory. The communication capability of the media controllers 104 and/or their capability to manage the memory on the integrated circuit (IC) dies within the respective packages can be used by the controller 227 to improve performance of the memory sub-system 110.

For example, the controller 227 can communicate with the embedded controllers 104 of the memory components 221, . . . , 223 on the memory module 205 via separate serial connections. Using the serial connections in parallel can increasing the access bandwidth while increasing the memory capacity of the memory module 205.

Further, the controller 227 of the memory module 205 can communicate with the controller 229 of the storage device 209 via a serial connection. When multiple storage devices (e.g., 209) are used, the controller 227 of the memory module 205 can communicate with the controller (e.g., 229) of the storage devices (e.g., 209) via multiple serial connections. When the serial connections are used in parallel, both the access bandwidth and storage capacity can be increased.

Furthermore, the controller 229 of the storage device 209 can communicate with the embedded controllers 104 of the memory components 223, . . . , 225 via separate serial connections. Using the serial connections in parallel can increasing the access bandwidth while increasing the storage capacity of the storage device 209.

Optionally, the controller 229 of the storage device 209 is configured on the memory module 205 and connected to the embedded controllers 104 of the memory components 223, . . . , 225 via a set of serial connections. The controller 229 and the controller 227 can be part of a controller fabric/hierarchy disposed on the memory module 205.

Optionally, or in combination, the controller 227 of the memory model 205 can be connected to some of the embedded controllers 104 of the memory components (e.g., 223) directly through one or more serial connections without going through the controller 229. For example, the memory of type B 223 in the storage device 209 can be connected to the controller 227 in a same way as the memory of type B 223 in the memory module 205; and such a connection can increase the capacity of memory of type B 223 and/or increases data access bandwidth to memory of type B 223, as if the added memory component were disposed/mounted on the memory module 205.

In general, a plurality of memory modules (e.g., 205) can be coupled to the memory bus 203; and a plurality of storage devices (e.g., 209) can be coupled to the peripheral interconnect 207. In some instances, the peripheral interconnect 207 and the storage devices (e.g., 209) are optional and can be absent from the computing system. In other instances, the memory bus 203 and the memory modules (e.g., 205) can be optional and can be absent from the computing system.

In a possible configuration when a plurality of memory modules (e.g., 205) are coupled to the memory bus 203, one of the memory modules (e.g., 205) has memory of type A 221; and another of the memory modules has memory of type B 223 that is accessible at a speed lower than the memory of type A 221 in a separate memory module (e.g., 205).

Similarly, in a possible configuration when a plurality of storage devices (e.g., 209) are coupled to the interconnect 207, one of the storage device (e.g., 209) has memory of type B 223, and another of the storage devices has memory of type C 225 that is accessible at a speed lower than the memory of type B 223 in a separate storage device (e.g., 209).

The processing device 118 and/or the MMU 213 are configured via instructions (e.g., an operating system and/or one or more device drivers) to access a portion of memory in the computer system via another portion of memory in the computer system using a paging technique and/or a memory map interface.

In one embodiment, the controller 227 of the memory module 205 can be configured to present the memory capability of the storage device 209 as part of the memory of the memory module 205. Thus, the host system 120 can access the storage device 209 and/or the remote storage device 114 as part of the memory module 205.

For example, memory of type B 223 of the memory module 205 can be accessed via memory of type A 221 of the memory module 205 (or another memory module).

For example, memory of type B 223 of the storage device 209 can be accessed via memory of type A 221 of the memory module 205 and/or via memory of type B 223 of the memory module 205.

For example, memory of type C 225 of the storage device 209 can be accessed via memory of type A 221 of the memory module 205, via memory of type B 223 of the memory module 205, and/or via memory of type B 223 of the storage device 209 (or another storage device).

For example, in some instances, memory of type A 221 and memory of type B 223 in the same memory module 205 (or different memory modules) are addressable directly and separately over the memory bus 203 by the memory management unit 213 of the processing device 118. However, since the memory of type B 223 is slower than memory of type A 221, it is desirable to access the memory of type B 223 via the memory of type A 221.

In other instances, memory of type B 223 of the memory module 205 is accessible only through addressing the memory of type A 221 of the memory module 205 (e.g., due to the size restriction in the address portion of the memory bus 203).

The data stream segregator 113 can identify a data stream and instruct a controller X 227 in the memory module 205 to adjust data placement for the data stream according to the characteristics of the data stream.

For example, the controller X 227 can perform data transfer/movement between the memory of type A 221 and the memory of type B 223 within the memory module 205 for a data stream.

Further, the controller X 227 in the memory module 205 can communicate with a controller Y 229 in the storage device 209 to perform data transfer/movement between memories 223 to 225 in the storage device 209, and/or between the storage device 209 and the memory module 205.

Further, the controller X 227 in the memory module 205 can communicate with a controller in the remote device 114 to perform data transfer/movement between the remote device 114 and the memory module 205.

In general, the memory sub-systems (e.g., 205 and 209) can include media, such as memory (e.g., 221, . . . , 223, . . . , 225). The memory (e.g., 221, . . . , 223, . . . , 225) can includes volatile memory, non-volatile memory (NVM), and/or a combination of such. In some embodiments, the computer system includes at least one memory sub-system that is a storage device 209. An example of a storage device 209 is a solid-state drive (SSD). In some embodiments, the computer system includes at least one memory sub-system that is a hybrid memory/storage system configured as a memory module 205. The processing device 118 can write data to each of the memory sub-systems (e.g., 205 and 209) and read data from the memory sub-systems (e.g., 205 and 209) directly or indirectly.

The computing system of FIG. 2 can be used to implement a desktop computer, laptop computer, network server, mobile device, or such computing device that includes a memory and a processing device. The processing device 118 can read data from or write data to the memory sub-systems (e.g., 205 and 209).

The processing device 118 can be coupled to a memory sub-system (e.g., 205, 209) via one or more physical interface (e.g., 203, 207).

As used herein, "coupled to" generally refers to a connection between components, which can be an indirect communicative connection or direct communicative connection (e.g., without intervening components), whether wired or wireless, including connections such as, electrical, optical, magnetic, etc.

Examples of a physical host interface include, but are not limited to, a serial advanced technology attachment (SATA) interface, a peripheral component interconnect express (PCIe) interface, universal serial bus (USB) interface, Fibre Channel, Small Computer System Interface (SCSI), Serial Attached SCSI (SAS), etc.

The physical host interface can be used to transmit data between the processing device 118 and the memory sub-system (e.g., 209). The computer system can further utilize an NVM Express (NVMe) interface to access the memory (e.g., 223, . . . , 225) when the memory sub-system 209 is coupled with the peripheral interconnect 207 via the PCIe interface. The physical host interface can provide an interface for passing control, address, data, and other signals between the memory sub-system (e.g., 209) and the processing device 118.

In general, a memory sub-system (e.g., 205 and 209) includes a printed circuit board that connects a set of memory devices, such as memory integrated circuits, that provides the memory (e.g., 221, . . . , 223, . . . , 225). The memory (e.g., 221, . . . , 223, . . . , 225) on the memory sub-system (e.g., 205 and 209) can include any combination of the different types of non-volatile memory devices and/or volatile memory devices.

An example of non-volatile memory devices includes a negative-and (NAND) type flash memory or a negative-or (NOR) type flash memory. A memory integrated circuit can include one or more arrays of memory cells, such as single level cells (SLCs), multi-level cells (MLCs), triple level cells (TLCs), quad-level cells (QLCs), etc. In some implementations, a particular memory device can include both an SLC portion and an MLC (or TLC or QLC) portion of memory cells. Each of the memory cells can store one or more bits of data used by the host system 120. Although non-volatile memory devices such as NAND type flash memory are described, the memory integrated circuits can be based on any other type of memory such as a volatile memory. In some implementations, the memory (e.g., 221, ..., 223, ..., 225) can include, but are not limited to, random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), and/or a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices can be grouped as memory pages or data blocks that can refer to a unit of the memory device used to store data.

A memory sub-system (e.g., 205 or 209) can have a controller (e.g., 227 or 229) that communicate with the memory (e.g., 221, ..., 223, ..., 225) to perform operations such as reading data, writing data, or erasing data in the memory (e.g., 221, ..., 223, ..., 225) and other such operations, in response to requests, commands or instructions from the processing device 118 and/or the memory management unit (MMU) 213.

The controller 227 can communicate with the controllers of storage devices (e.g., 209 and/or 114) and/or the embedded controllers 104 via the interconnect 207 and/or the network 219 to cause the controllers of storage devices to perform operations such as reading data, writing data, or erasing data in the memory (e.g., 223, ..., 225) in the respective storage devices and other operations.

The controllers (e.g., 227, 229, and/or 104) can include hardware such as one or more integrated circuits and/or discrete components, a buffer memory, or a combination thereof. The controller (e.g., 227 or 229) can be a microcontroller, special purpose logic circuitry (e.g., a field programmable gate array (FPGA), an application specific integrated circuit (ASIC), etc.), or another suitable processor. The controllers (e.g., 227, 229 and/or 104) can include one or more processors (processing devices) configured to execute instructions stored in local memory.

The local memory of the controller (e.g., 227 or 229) can include an embedded memory configured to store instructions for performing various processes, operations, logic flows, and routines that control operation of the memory sub-system (e.g., 205 or 209), including handling communications between the memory sub-system (e.g., 205 or 209) and the processing device 118/MMU 213, and other functions described in greater detail below. The local memory of the controller (e.g., 227 or 229) can include read-only memory (ROM) for storing micro-code and/or memory registers storing, e.g., memory pointers, fetched data, etc.

While the example memory sub-systems (e.g., 205 and 209) in FIG. 2 have been illustrated as including controllers (e.g., 227 and 229), in another embodiment of the present disclosure, a memory sub-system (e.g., 205 or 209) may not include a controller (e.g., 227 or 229), and can instead rely upon external control (e.g., provided by the MMU 213, or by a processor or controller separate from the memory sub-system (e.g., 205 or 209)).

In general, the controllers (e.g., 227, 229, and/or 104) can receive commands, requests or instructions from the processing device 118 or MMU 213 in accordance with a standard communication protocol for the communication channel (e.g., 203 or 207) and can convert the commands, requests or instructions in compliance with the standard protocol into detailed instructions or appropriate commands within the memory sub-system (e.g., 205 or 209) to achieve the desired access to the memory (e.g., 221, ..., 223, ..., 225). For example, the controller (e.g., 227, 229, and/or 104) can be responsible for operations such as wear leveling operations, garbage collection operations, error detection and error-correcting code (ECC) operations, encryption operations, caching operations, and address translations between a logical block address and a physical block address that are associated with the memory (e.g., 221, ..., 223, ..., 225). The controllers (e.g., 227, 229, and/or 104) can further include serializer/deserializer (SerDes) for serial interconnections. The controllers (e.g., 227, 229, and/or 104) can further include host interface circuitry to communicate with the processing device 118 via the physical host interface. The host interface circuitry can convert the commands received from the processing device 118 into command instructions to access the memory devices (e.g., 221, ..., 223, ..., 225) as well as convert responses associated with the memory devices (e.g., 221, ..., 223, ..., 225) into information for the processing device 118.

The memory sub-system (e.g., 205 or 209) can also include additional circuitry or components that are not illustrated. In some implementations, the memory sub-system (e.g., 205 or 209) can include a cache or buffer (e.g., DRAM) and address circuitry (e.g., a row decoder and a column decoder) that can receive an address from the controller (e.g., 227 or 229) or the MMU 213 and decode the address to access the memory (e.g., 221, ..., 223, ..., 225).

In one example, the interconnect 207, or the memory bus 203, has one or more connectors to provide the memory sub-system (e.g., 209 or 205) with power and/or communicate with the memory sub-system (e.g., 209 or 205) via a predetermined protocol; and the memory sub-system (e.g., 209 or 205) has one or more connectors to receive the power, data and commands from the processing device 118. For example, the connection between the connector on the interconnect 207 and the connector on a memory sub-system (e.g., 209) can utilize a PCIe bus or a SATA bus.

In some instances, the data stream segregator 113 can be implemented at least in part in the host system 120.

Figure 3:
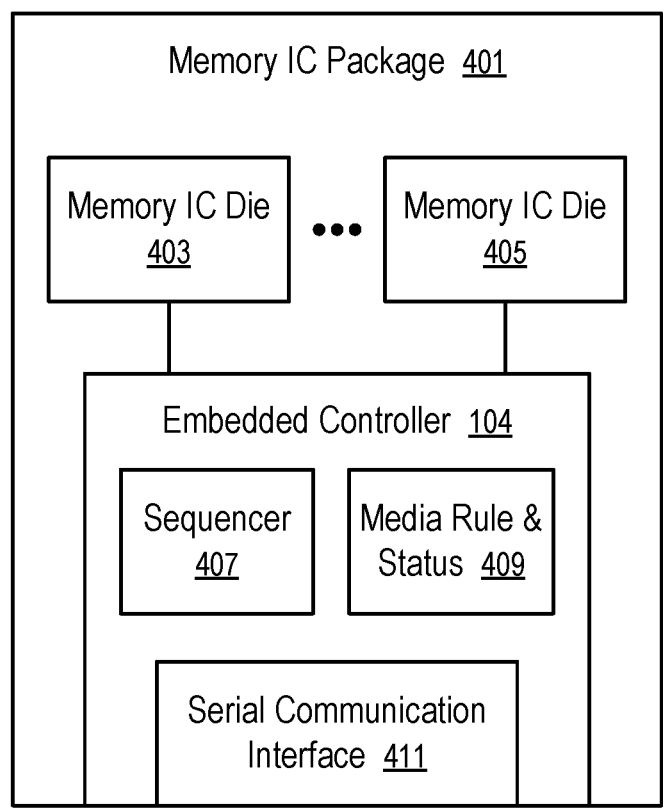
FIG. 3 illustrates a memory component having an embedded controller according to one embodiment.

FIG. 3 illustrates a memory component having an embedded controller 104 according to one embodiment.

In FIG. 3, the memory component has a package 401 that is a supporting case encapsulating the integrated circuit dies, such as memory integrated circuit dies 403, ..., 405 and a die having the integrated circuit of an embedded controller 104. The memory component can have a set of pins to receive power for its operations and/or a set of pins connected to a serial communication interface 411.

For example, the serial communication interface 411 can support communication in accordance with a protocol of PCIe, STA, USB, or Interlaken, etc.

Optionally, the embedded controller 104 can have a sequencer 407 that can generate the addresses used to step through the microprogram of a controller 104. For example, the embedded controller 104 can have a microprogram configured to apply, implement, and/or enforce media rules 409 and/or collect and/or maintain status information 409 of the memory formed in the memory integrated circuit dies 403, ..., 405.

The embedded controller 104 is configured to deserialize the data packets communicated to the serial communication interface 411 through a serial communication connection, configured to separate commands, addresses, and/or data in accordance with a predetermined serial communication protocol, and configured to execute/implement the commands according to the addresses and/or data. For example, a read command can require storing data into one or more of the memory IC dies 403, ..., 405; and a write command can require retrieving data from one or more of the memory IC dies 403, ..., 405. A serializer of the serial communication interface 411 can convert a result of executing a command into data packets for communication over the serial communication connection in accordance with the predetermined serial communication protocol. In some instances, the media rules 409 can be configured or programmed during an initialization phase of the memory component that is encapsulated within the package 401.

Figure 4:
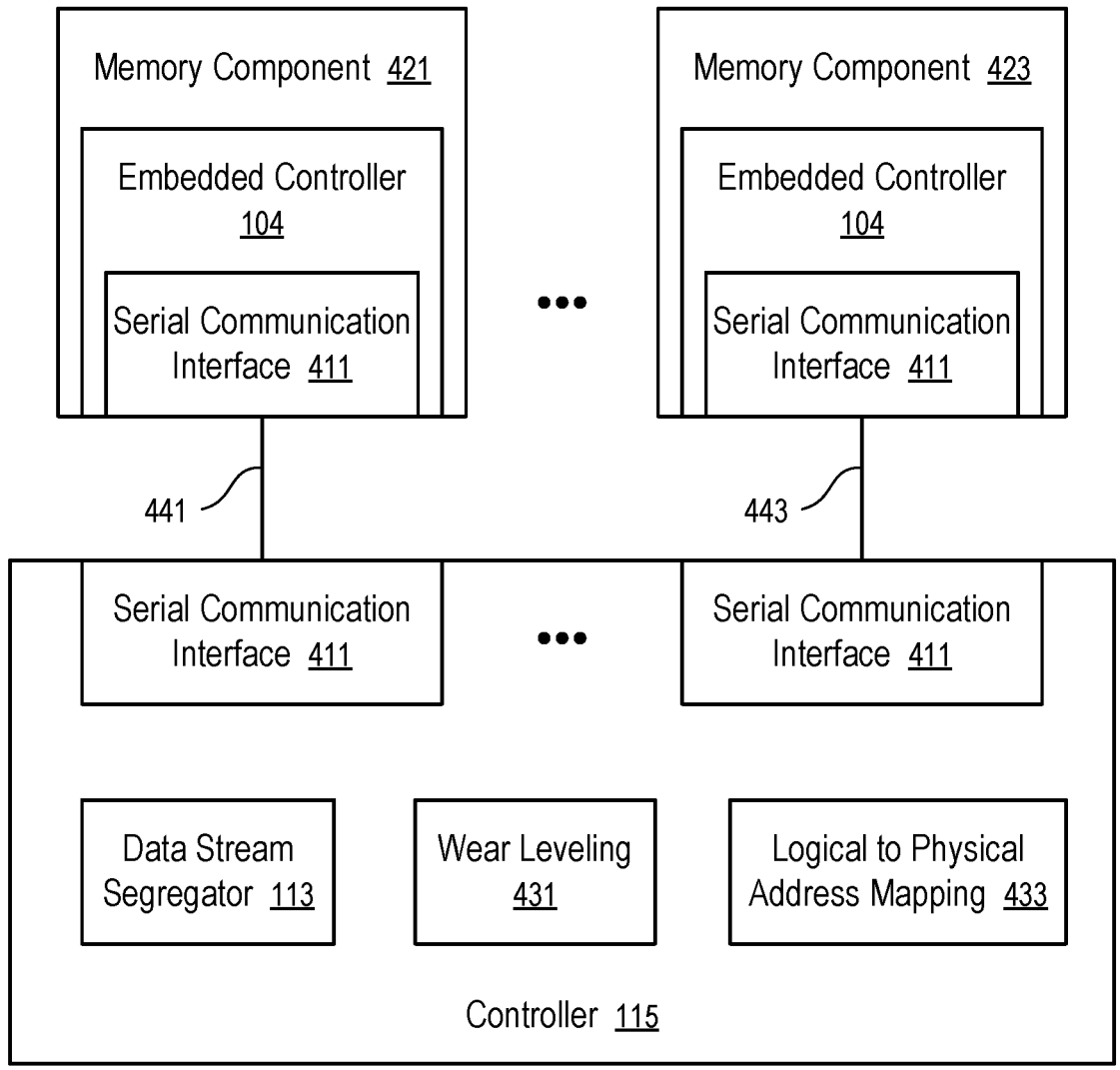
FIG. 4 illustrates memory components having embedded controllers that are connected separately to an external controller according to one embodiment.

FIG. 4 illustrates memory components 421, ..., 423 having embedded controllers 104 that are connected separately to an external controller 115 according to one embodiment. For example, the configuration of FIG. 4 can be implemented in the computer system of FIG. 1 or FIG. 2, using embedded controllers 104 illustrated in FIG. 3. For example, the controller 115 of FIG. 4 can be implemented via a combination of controllers 227, 229 in FIG. 2.

In FIG. 4, the controller 115 has a set of serial communication interfaces 411 that are connected to the respective serial communication interfaces 411 of the memory components 421, ..., 423 via separate serial connections 441, ..., 443. The serial connections 441, ..., 443 can be used concurrently and in parallel to increase the data access bandwidth between the memory components 421, ..., 423 as a whole and the controller 115.

In general, the memory components 421, ..., 423 can include memory of different performance tiers; and each memory performance tier can have memory components 421, ..., 423 of similar or different memory capacities.

The controller 115 can maintain a logical to physical address mapping 433 to dynamically distribute data to memory components 421, ..., 423. The address mapping 433 can convert the logical block address, used by the host 120 to specify a memory location, into a physical address in a memory component 421, ..., or 423. Through the adjustment of the logical to physical address mapping 433, the controller 115 can dynamically adjust data placements within the memory sub-system 110 implemented using the memory components 421, ..., 423.

Dynamic data placement can be used to perform wear leveling 431. For example, certain types of memory (e.g., flash memory) have limited endurance for repeated write/erasure operations. The controller 115 can use the logical to physical address mapping 433 to perform wear leveling 431 such that write/erasure operations are substantially evenly distributed not only across the IC dies 403, ..., 405 within an IC package 401, but also across the memory components 421, ..., 423 in separate IC packages 401, across the separate storage devices 209 (e.g., configured as SSDs), and/or across the separate memory modules 205.

Dynamic data placement can be used by the controller to improve performance by utilizing parallel connections 441, ..., 443 to multiple memory components 421, ..., 423. For example, a set of data to be stored can be distributed to the multiple memory components 421, ..., 423; and write command for the set of data can be communicated in parallel through the separate connections 441, ..., 443 for parallel operations. Similarly, the set of data can be retrieved from the multiple memory components 421, ..., 423 via the parallel operations. Thus, the high bandwidth offered by the separate connections can be utilized by the controller 115 to improve data access performance.

Dynamic data placement can be used by the data stream segregator 113 to improve performance. For example, the controller 115 can map hot data to a memory tier of higher performance and map cold data to a memory tier of lower performance. For example, the controller 115 can dynamically use a portion of a memory tier of higher performance as a buffer for a memory tier of lower performance to coalesce and serialize write operations directed to the memory tier of lower performance.

A conventional system can have a cache structure where slower memories are accessed through faster memories. When a processor accesses data that is currently in a slower memory, the data is loaded into a faster memory as a proxy of the data in the slower memory. Subsequently, the processor operates on the proxy/cache of the data in the faster memory for improved performance. The faster memory typically has a capacity smaller than the slower memory. Thus, only a portion of the data in the slower memory can be cached concurrently in the faster memory. A cache miss occurs when an item accessed by the processor is not currently in the faster memory. A cache hit occurs when an item accessed by the processor is currently in the faster memory. The percentage of accesses that result in cache hits is a cache hit ratio. Improving the cache hit ratio can improve the operating performance of the computing system. However, it is a challenge to design a cache policy to improve cache hit ratio.

At least some aspects of the present disclosure address the above and other deficiencies by data stream segregation for different tiers of memories.

Memories of different tiers can have different data access speeds. The overall system performance can improve by optimizing data placement in connection with data access speeds of the memories and data access frequencies and patterns. For example, to improve operating performance of a computing system, frequently used data can be placed in a faster memory; and less frequently used data can be placed in a slower memory. The faster memory can be optionally configured as a cache memory for the slower memory. In some instances, at least a portion of the slower memory can be accessed directly without going through the faster memory as a cache, when the access to the slower memory is infrequent.

Memories of different tiers can have different operating characteristics. For example, certain types of memory can be slower in handling random writes than sequential writes. For example, write operations on certain types of memory can reduce performance levels on read operations. For example, certain types of memory can have limited endurance for repeated write/erasure operations. Separate data streams can be generated to target different memory tiers to optimize system performance in view of the operating characteristics.

For example, a stream of mixed read operations and write operations in a memory region of a certain type can be cached to separate the read operations and write operations to avoid write operations from interfering with and/or blocking read operations in the memory region. For example, a stream of random write access can be cached and reorganized as a stream of sequential write access.

Further, data usage information can be optionally applied in a predictive model, trained using a machine learning technique, to predict workload intend and thus data movements across the memories of different tiers to segregate and/or organize data access streams. Thus, data placement can also be based at least in part on the predictions of data usage for a subsequent time period.

For example, data usage information can include the history of data accesses and attributes related to data accesses, such as applications or programs that uses the data, user accounts in which the data accesses are made, virtual machines that access the data, objects to which the data belong, mapping between data blocks to objects as organized in applications, relations among objects, etc. The data movements predicted according to the data usage information can be performed preemptively to improve the operating performance of the computing system. The prediction model can be initially trained offline using historic data usage information and historic data movements caused by data accesses associated with the data usage information. The training minimizes the differences between the historic data movements and predictions generated by applying the historic data usage information in the prediction model. Subsequently, the prediction model can be used for real time prediction using the real time data usage information. Performing the predicted data movements can reduce the need to move data in response to data access requests. The data movements caused by the real time data access requests, and/or indications of whether the predicted data movements reduce the need to move data across the tiers, can be used to identify desired real time prediction results. The desired results can further train the prediction model using a reinforcement machine learning technique for continued improvement and adaptation of the prediction model. The prediction model can be dynamically adapted to the current workloads in real time usage of the computing system.

Figure 5:
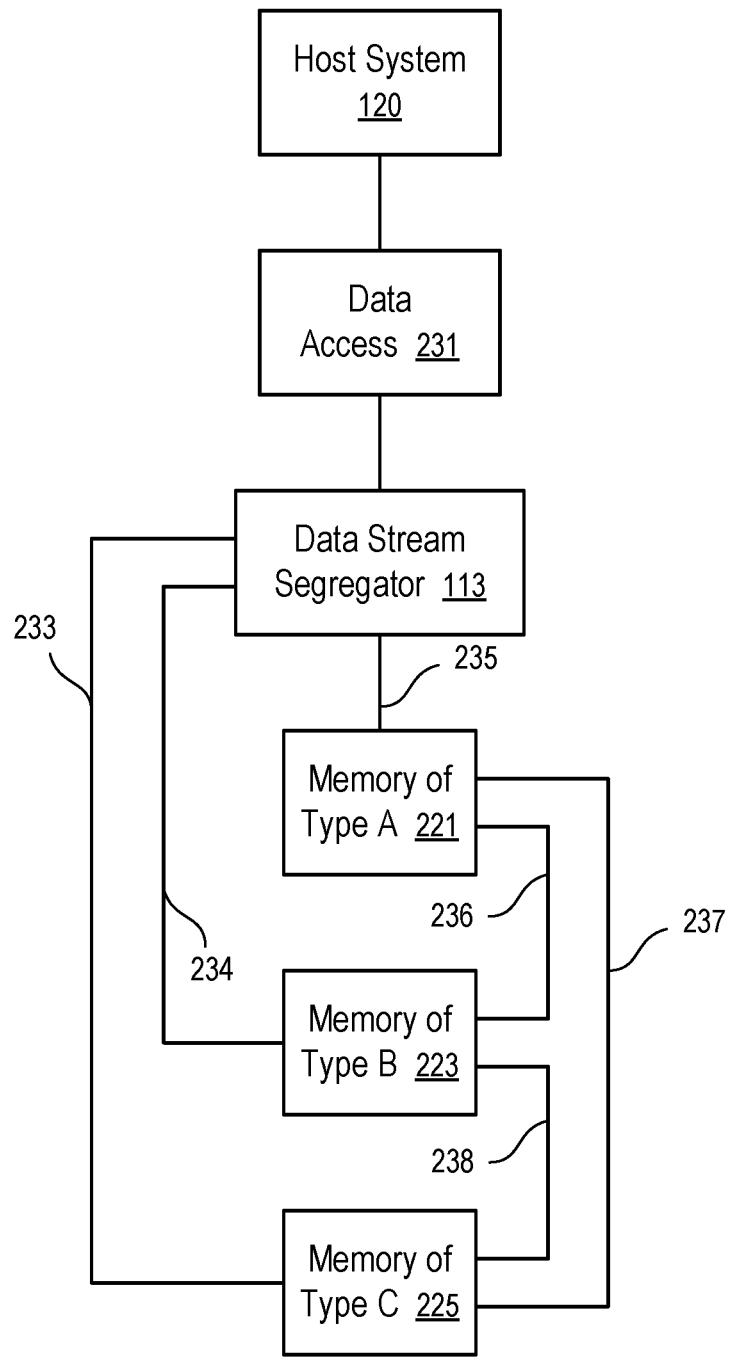
FIG. 5 illustrates an example of data stream segregation.

FIG. 5 illustrates an example of data stream segregation. For example, the data stream segregation can be implemented in a computer system of FIG. 1 or FIG. 2 using the controller configurations of FIG. 3 and/or FIG. 4.

In FIG. 5, the communications between the host system 120 and the data stream segregator 113 of a memory module 205 include messages for data access 231 of different characteristics. The data stream segregator 113 has access to different tiers of memories (e.g., 221, 223, 225) (e.g., through the controller 115 of FIG. 4).

For example, the data stream segregator 113 can optionally place the data involved in a data request 231 to memory of type A 221 in the memory module 205, memory of type B 223 in the memory module 205, memory in a storage device 209 connected to the memory module 205 via an interconnect 207, and/or memory in a remote device 114 connected to the memory module 205 via a network 219.

For example, memory of type A 221 can be a memory tier having a performance level higher than memory of type B 223; and the memory of type B 223 can be a memory tier having a performance level higher than memory of type C 225.

For example, memory of type A 221 can be implemented in the memory module 205 using DRAM and/or cross point memory; memory of type B 223 can be implemented in the memory module 205 or a storage device 209 controlled by the memory module 205 using SLC flash memory; and memory of type C can be implemented in the storage device 209 and/or the remote device 114 using TLC or QLC flash memory.

The data stream segregator 113 can separate data into groups based on their usage frequency. For example, the most frequently used group of data can be placed in the memory of type A 221; the less frequently used group of data can be placed in the memory of type B 223; and the infrequently used group of data can be placed in the memory of type C 225. The data usage frequency can be measured based on the data access 231 in a past period of time and/or based on the prediction of data access for a subsequent period of time. The most frequently used group of data can be classified as hot data; the less frequently used group of data can be classified as warm data; and the infrequently used group of data can be classified as cold data. In general, more or less than three groups of data can be classified based on usage frequency for data placement on corresponding memory tiers.

When the data usage frequency changes, the data stream segregator 113 can adjust data placements accordingly. For example, when hot data cools down to become warm, the data can be moved from the memory of type A 221 to memory of type B 223 through sequential write operations; and the less frequently accessed warm data can be serviced from the memory of type B 223 directly until it cools further as cold data or heats up again as hot data. Similarly, data can be moved from memory of type B 223 to memory of type C 225 when the data becomes cold, or to memory of type B 223 from memory of type C 225 when the data becomes warm.

In some instances, memory of type B 223 is configured as cache or buffer of memory of type C 225; and memory of type A 221 is configured as cache or buffer of memory of type B 223.

The data stream segregator 113 not only manages data placement based on usage frequency, but also directs certain streams of data accesses 231 to the lower tier memories (e.g., 223 or 225) directly.

For example, when the host 120 writes data sequentially to a set of logical addresses, the sequential writes can be directed as a stream to the memory of type C 225 without degrading the performance of the host system 120. In some instances, the data stream segregator 113 can use a portion of the memory of type A 221 as a buffer for the stream of writes to the memory of type C 225, when the host 120 is sending the write requests at a rate that is higher than the memory of type C 225 can complete directly; and such write operations may not be counted as usage activities to increase the usage frequency of the respective data during the time period of writing the sequential stream to the memory of type C 225.

For example, when the host 120 writes data randomly to a set of addresses, the random writes can be directed as a stream to the memory of type B 223 without degrading the performance of the host system 120. When needed, the data stream segregator 113 can also use a portion of the memory of type A 221 as a buffer for the stream of random writes to the memory of type B 223. In some instances, it may be possible to direct the random writes to the memory of type C 225, especially when the stream is buffered using the memory of type A 221. However, the random writes may degrade the performance of the memory of type C 225 in processing other operations, such as read and/or sequential writes, and have undesirable effects, such as write amplification resulting from random writes, reduced longevity resulting from repeated writes, delaying/blocking read operations by write/erasure operations, etc. Directing the stream of random writes to the memory of type B 223 or the memory of type A 221 (depending on write frequency) can reduce or eliminate at least some of the undesirable effects. After the random writes are committed into the memory of type B 223 or the memory of type A 221, the data can be copied to the memory of type C 225 via sequential writes (e.g., when the data becomes cold). Thus, the data stream segregator 113 can convert and/or reduce random writes, initially committed to the memory of type B 223 (or the memory of type A 221), into a stream of sequential writes directed to the memory of type C 225.

In general, the processing device 118 can execute one or more operating systems to provide services, including acceleration of memory access in which a portion of memory in the computer system is accessed via another portion of memory in the computer system using a paging technique and/or a memory map interface, as discussed further below.

Figure 6:
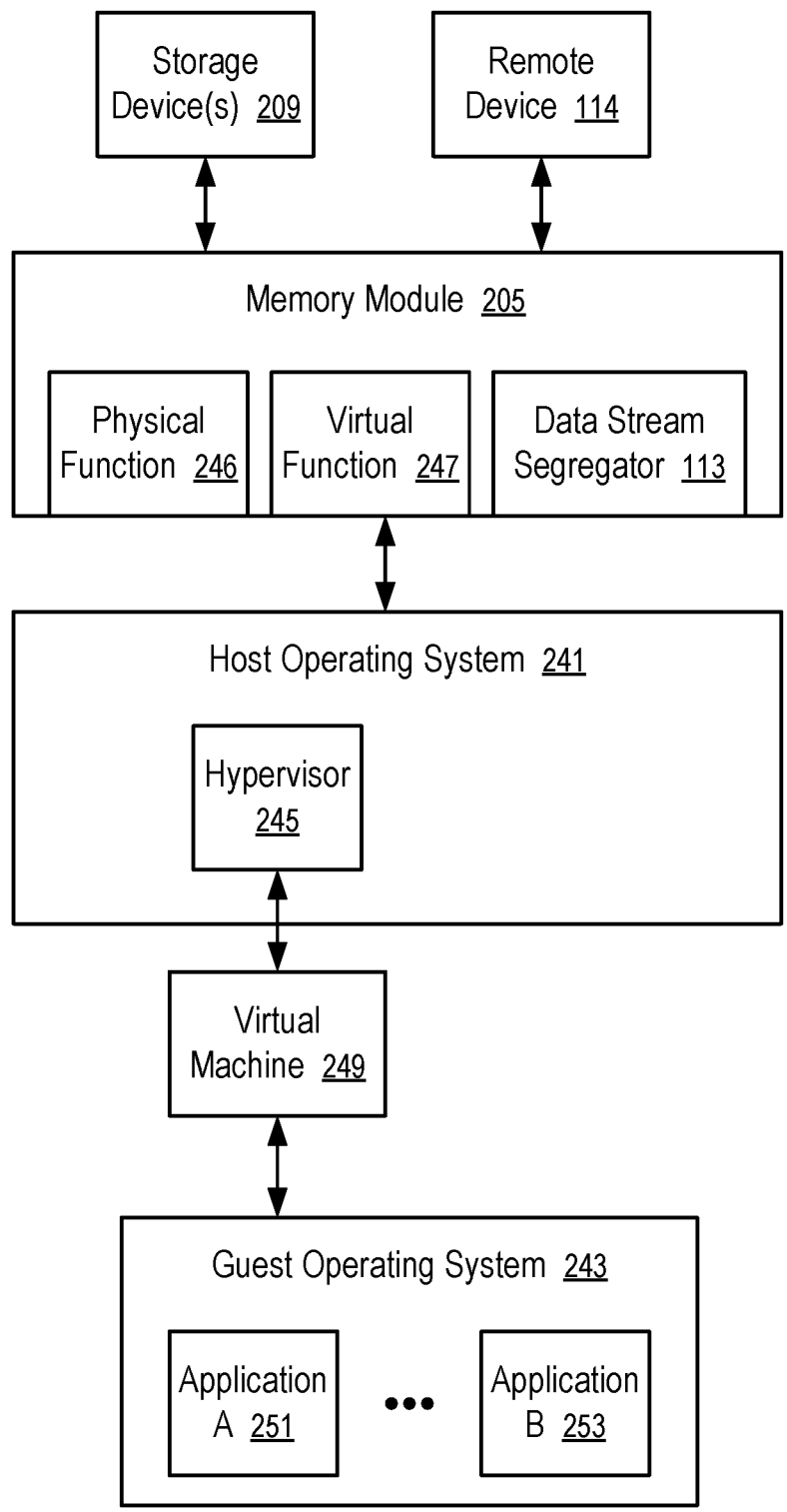
FIG. 6 shows a system having a data stream segregator.

FIG. 6 shows a system having a data stream segregator 113. For example, the system of FIG. 6 can be implemented in a computer system of FIG. 1 or 2.

The system of FIG. 6 includes a host operating system 241 that can run in the processing device 118 of the computer system of FIG. 1 or 2. The host operating system 241 includes one or more device drives that provides memory services using the memory (e.g., 221, ..., 223, ..., 225) of memory sub-systems, such as the memory module 205, the storage device 209, and/or the remote device 114.

The host operating system 241 includes a hypervisor 245 that provisions a virtual machine 249. The virtual machine 249 has virtual hardware implemented via the resources and services provided by the host operating system 241 using the hardware of the computing system of FIG. 1 or 2. For example, the hypervisor 245 can provision virtual memory as part of the virtual machine 249 using a portion of the memory (e.g., 221, ..., 223, ..., 225) of memory sub-systems, such as the memory module 205 and/or the storage device 209.

The virtual machine 249 allows a guest operating system 243 to provide resources and/or services to applications (e.g., 251, ..., 253) running in the guest operating system 243, in a way as the operating system 243 running on a physical computing machine that has the same or similar set of hardware as provisioning in the virtual machine. The hypervisor 245 manages the mapping between the virtual hardware provisioned in the virtual machine and the services of hardware in the computing system managed by the host operating system 241.

FIG. 6 illustrates an instance in which a virtual machine 249 is provisioned by the hypervisor 245. In general, the hypervisor 245 can provision a plurality of virtual machines (e.g., 249) that can run the same guest operating system 243, or different guest operating systems (e.g., 243). Different sets of users and/or application programs can be assigned to use different virtual machines.

In some instances, the host operating system 241 is specialized to provide services for the provisioning of virtual machines and does not run other application programs. Alternatively, the host operating system 241 can provide additional services to support other application programs, such as applications (e.g., 251, ..., 253).

In FIG. 6, the hypervisor 245 is configured to use a single-root I/O Virtualization to organize data streams of different characteristics/attributes. For example, the memory module 205 has a physical function 246 that can implement a plurality of virtual functions (e.g., 247). A virtual function 247 provides the service of the memory module 205 via the physical function 246. The hypervisor 245 allocates and reserves the virtual function 247 for memory access by a particular virtual machine 249, a particular application (e.g., 251 or 253), a particular user account, etc. Thus, the identifier of the virtual function 247 used to access the memory module 205 can be used to infer the data usage information of the data access, such as the identities of the virtual machine 249, the application 251 and/or the user account that are associated with and/or responsible for the data access made using the virtual function 247. Such information can be used in the data stream segregator 113 in machine learning to predict data workload and/or movements and in making real time predictions.

For example, the data stream segregator 113 can be trained to predict the use of a data item in a slower memory and load the data item into a faster memory before the data item actually requested for use by the virtual machine 249, the application 251 running in the virtual machine, and/or a user account operating the application 251. The prediction reduces the time between a request to use the data item and the availability of the item in the faster memory by loading, transferring, and/or, caching the item into the faster memory before the request to use the item reaches the memory module 205, which accelerates the data access of the page.

Preferably, the predictive data movement is performed within a same memory sub-system controlled by a data stream segregator 113, such as a combination of the memory module 205, the storage device 209 connected to the memory module 205, and/or the remote device 114 connected to the memory module 205. For example, the predictive data movement can be performed to copy data between the slower memory 223 in the memory module 205 and the faster memory 221 in the memory module 205, under the control of a controller 227 in the memory module 205 in response to one or more command, request, or instruction from the data stream segregator 113. For example, the predictive data movement can be performed to copy data between the memory module 205 and the storage device 209, or between the memory module 205 and the remote device 114.

In one embodiment, a controller 227 is configured to implement Message Passing Interface (MPI) and have variable-length messaging capability. The messaging capability allows the controller 227 to communicate with the storage device 209 and/or the remote device 114 to direct the data streams without involvement from the host system 120. Some details and examples about the messaging capability can be found in U.S. patent application Ser. No. 16/054,890, filed Aug. 3, 2018 and entitled "Memory Access Communications through Message Passing Interface Implemented in Memory Systems."

In one embodiment, the hypervisor 245 not only requests the device driver to access a memory (e.g., 221, ..., 223, ..., or 225) in a memory sub-system (e.g., memory module 205 or storage device 209) but also provides the device driver with information that can be used in making predictions of which data items in the memory (e.g., 221, ..., 223, ..., or 225) are likely to be used in a subsequent time period and which data items in the memory (e.g., 221, ..., 223, ..., or 225) are unlikely to be used in the subsequent time period. The information can be provided at least in part via the use of virtual functions (e.g., 247) that are pre-associated with certain data usage attributes, such as virtual machine 249, application 251, user account, etc.

For example, a page that is likely to be used can be referred to as a hot page; and a page that is unlikely to be used can be referred to as a cold page. The likelihood of a page being used in the subsequent time period can be referred to as the temperature of the page. The data stream segregator 113 uses the information provided/identified by the hypervisor 245 to predict the temperatures of the pages, moves cold pages from faster memory to slower memory, and moves hot pages from slower memory to faster memory to optimize the distribution of the pages in the memory (e.g., 221, ..., 223, ..., or 225) and accelerate data access.

Examples of information provided by the hypervisor 245 and used by the data stream segregator 113 to make the predictions include: sequences of pages being used in a prior time period, instances of requests to load pages from the slower memory to the faster memory, content attributes of the pages, ownership attributes of the pages, identifications of users or applications of the pages, an indication of whether pages are accessed in a sequential mode in a virtual machine and/or in a user account, an indication of whether page accesses are in a steady state, an indication whether a page used is associated with a huge page, mapping between data blocks and objects, etc.

Figure 7:
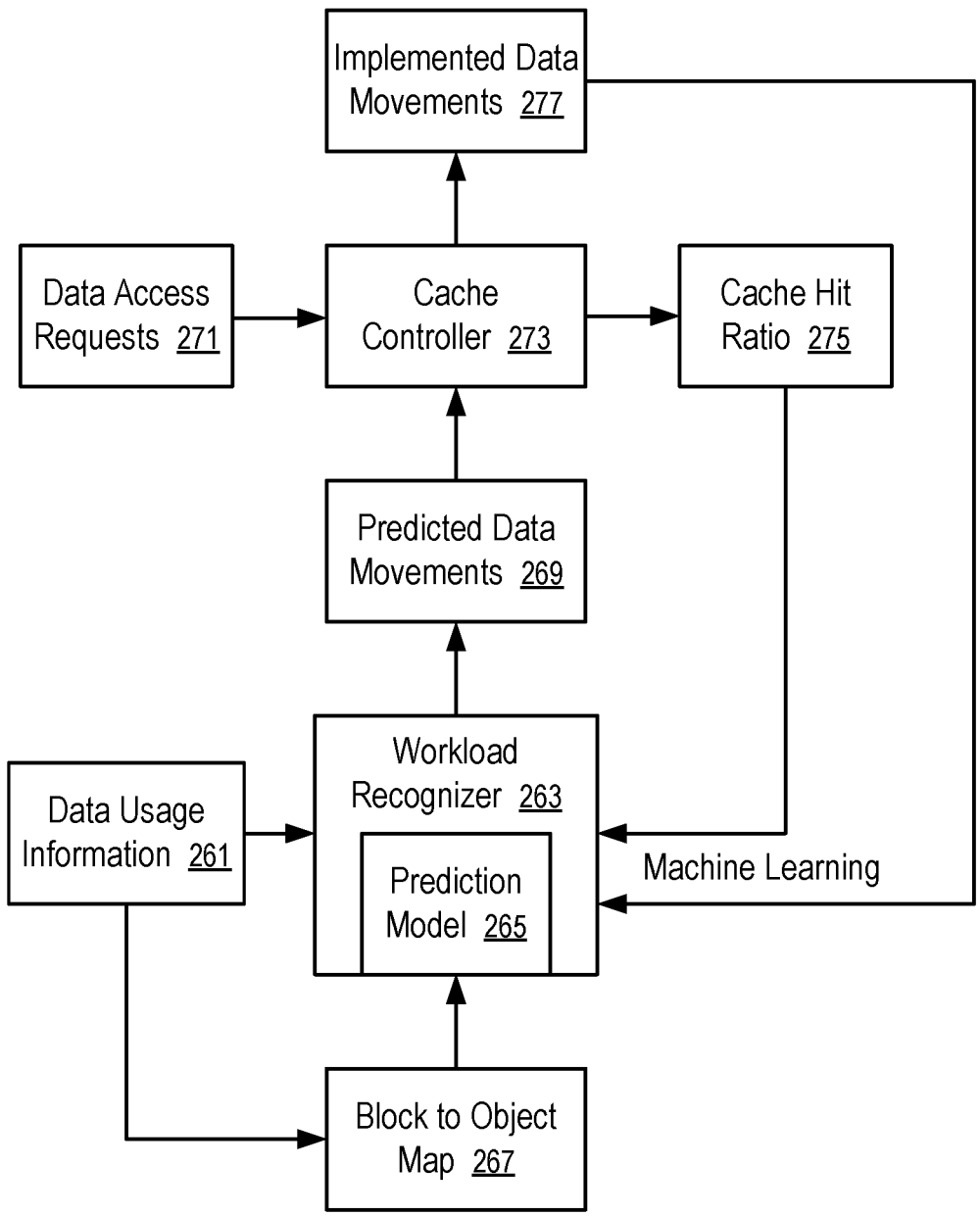
FIG. 7 illustrates an implementation of a data stream segregator having a prediction model.

FIG. 7 illustrates an implementation of a data stream segregator 113 having a prediction model 265.

In FIG. 7, the data stream segregator 113 includes a cache controller 273 and a workload recognizer 263. The workload recognizer 263 includes a prediction model 265 that can be implemented using an artificial neural network.

The cache controller 273 processes data access requests 271 from the host system 120. The cache controller 273 monitors a higher performance memory used as a cache relative to a lower performance memory, analyzes the usage of the cache, optimizes the usage of the cache, and manages the use of the cache. Conventional cache techniques can be implemented in the cache controller 273.

In response to the data access requests 271, the cache controller 273 determines whether the data targeted by the requests 271 are in the higher performance memory at the time of the requests 271. If so, the cache controller 273 counts the corresponding data access requests 271 as cache hits; and otherwise, the cache controller 273 counts the corresponding data access requests 271 as cache misses. Thus, the cache controller 273 can generate the measurement of cache hit ratio 275 for the data distribution at the time of the data access requests 271.

Optionally, the cache controller 273 may service a portion of data access requests 271 directly from the lower performance memory without caching/loading the corresponding data into the higher performance memory.

The cache policy used the cache controller 273 can be used to identify data movements 277 that are implemented by the cache controller 273.

The data usage information 261 corresponding to the data access requests 271 is collected for an initial time period of the operation of the computing system for the training of the prediction model 265. For example, a supervised machine learning technique can be used to train the artificial neural network of the prediction model 265 to minimize the different between the data movements 277 implemented by the cache controller 273 responsive to the data access requests 271 and the data movement 269 predicted using the prediction model 265 using the data usage information 261 corresponding to the data access requests 271. The machine learning can be performed offline on another computing device to establish the initial prediction model 265.

Subsequently, the prediction module 265 can be used in the workload recognizer 263 to make real time predictions of data movements 269 based on real time data usage information 261 and real time data access requests 271. The workload recognizer 263 instructs the cache controller 273 to perform the predicted data measurements, which can cause changes in the cache hit ratio 275. The prediction model 265 is adjusted and/or trained in real time using a hybrid reinforcement machine learning technique to continuously drive up the cache hit ratio 275. Thus, the prediction model 265 can automatically adapt to the current workload of the computing system and implement predicted data movements 269 to achieve a cache hit ratio 275 higher than that can be achieved via the cache controller 273 alone.

Preferably, the predictions made by the workload recognizer 263 are based at least in part on a block to object map 267. For a statistical analysis of the data usage information 261, the data stream segregator 113 can identify the underlying relations among data blocks. For example, some data blocks represent parts of a same data object in an application; parts of a data object are accessed together; some data objects have a pattern of being accessed in a particular order; the access to one data object in a user account running an application on a virtual machine can have a high probability of leading to the access to another data object. The block to object map 267 identifies the relations that improve the prediction accuracy of the workload recognizer 263.

In one example, a data stream segregator 113 can receive, from a processing device 118, data access requests 231 for a memory sub-system 110 having multiple tiers of memory components (e.g., 109A, ..., 109N in FIG. 1; or 221, ..., 223, ..., 225 in FIG. 2).

For example, the different tiers of memory can include a top tier (e.g., 221), a middle tier (e.g., 223), and a bottom tier (e.g., 225). The top tier (e.g., 221) can be implemented using Dynamic Random-Access Memory (DRAM) and/or cross point memory. In some instances, a combination of the DRAM and cross point memory with an energy storage unit (e.g., a capacitor and/or a battery) can support the implementation of a power safe routine, where in response to the unexpected loss of system power, the power available in the energy storage unit can be used to store the data in DRAM into the cross point memory in an emergent shutdown process, such that no data in the DRAM is corrupted or lost due to the unexpected loss of system power. Thus, the combination has the advantage of the access speed of DRAM and the non-volatile characteristics of cross point memory.

For example, a middle tier (e.g., 223) can be implemented using Single Level Cell (SLC) flash memory; and a bottom tier (e.g., 225) can be implemented using Triple Level Cell (TLC) flash memory or Quad-Level Cell (QLC) flash memory.

In another example, the top tier (e.g., 221) is implemented using a volatile random access memory (e.g., DRAM or SRAM); the middle tier (e.g., 223) is implemented using cross point memory; and the bottom tier (e.g., 225) is implemented using flash memory.

For example, the top tier memory (e.g., 221) can be configured in a memory module 205 having a controller 227; the middle tier memory (e.g., 223) can be configured in one or more storage device 209 having their separate controllers 229 that are connected to the controller 227 of the memory module 205 without going through the host system 120; and the bottom tier memory (e.g., 225) can be configured in one or more further storage device 209 having their separate controllers 229 that are also connected to the controller 227 of the memory module 205 without going through the host system 120.

For example, the top tier memory (e.g., 221) can be configured in a memory module 205 having a controller 227; the middle tier memory (e.g., 223) can be configured in one or more storage device 209 having their separate controllers 229 that are connected to the controller 227 of the memory module 205 without going through the host system 120; and the bottom tier memory (e.g., 225) can be configured in one or more remote devices 114 having their separate controllers that are connected to the controller 227 of the memory module 205 via a computer network 219.

The data stream segregator 113 can generate multiple data access streams (e.g., 233 to 238) in accordance with the data access requests 231 and access characteristics of the requests.

For example, the characteristics of the data access streams can be based on the access frequency levels of data in the data access streams and based on the randomness levels of address in the data access streams. The data stream segregator 113 can be configured to determine data placement among the different tiers based on identification of the data access streams suitable for the respective tiers.

For example, a first stream (e.g., 235) can be identified for having a usage frequency level that is above a threshold (e.g., in a recent time period or predicted for a subsequent time period); and the addresses in the first stream has a random or non-sequential sequence. Data of such a first stream is suitable for placement in the top tier (e.g., 221).

For example, a second stream (e.g., 233) can be identified for having sequential addresses for write operations; and data of such a second stream is suitable for placement in the bottom tier (e.g., 225).

For example, a third stream (e.g., 234) can be identified for having a usage frequency level that is below the threshold (e.g., in a recent time period or predicted for a subsequent time period); and the addresses in the third stream appear has a random or non-sequential sequence. Data of such a third stream is suitable for placement in the middle tier (e.g., 223).

The data stream segregator 113 can match characteristics of the data access streams (e.g., 233 to 238) with characteristics of the different tiers of memory components. Then, the data stream segregator 113 can direct the data access streams (e.g., 233 to 238) to the different tiers of memory components based on matching the characteristics of the data access streams with characteristics of different tiers of memory components.

For example, the data stream segregator 113 can be configured to direct a stream 235 of data having high usage frequencies and non-sequential writes to the top tier (e.g., 221), direct a stream 233 of sequential writes to the bottom tier (e.g., 225), and direct a stream 234 of data having non-sequential, non-high frequency writes to the middle tier (e.g., 223).

Optionally, the data stream segregator 113 can instruct the controller 227 of the memory module 205 to buffer, in the top tier (e.g., 221), the streams (e.g., 234 or 233) that are directed to the middle or bottom tier.

Optionally, the frequency levels of data used in a stream can be predicted based at least in part on a predictive model 265 having an artificial neural network, as discussed in connection with FIG. 7.

Optionally, the data stream segregator 113 can buffer, in one tier, a stream directed to another tier that has a performance level lower than the tier used to buffer the stream.

Optionally, the data stream segregator 113 can generate, a target stream (e.g., 236, 237, or 238) for a target tier (e.g., 223 or 225) by coalescing and serializing write operations of another stream (e.g., 235) in a tier (e.g., 221) having a performance level higher than the target tier (e.g., 223 or 225). The performance level can be in access speed and/or endurance in repeated write/erasure operations.

Figure 8:
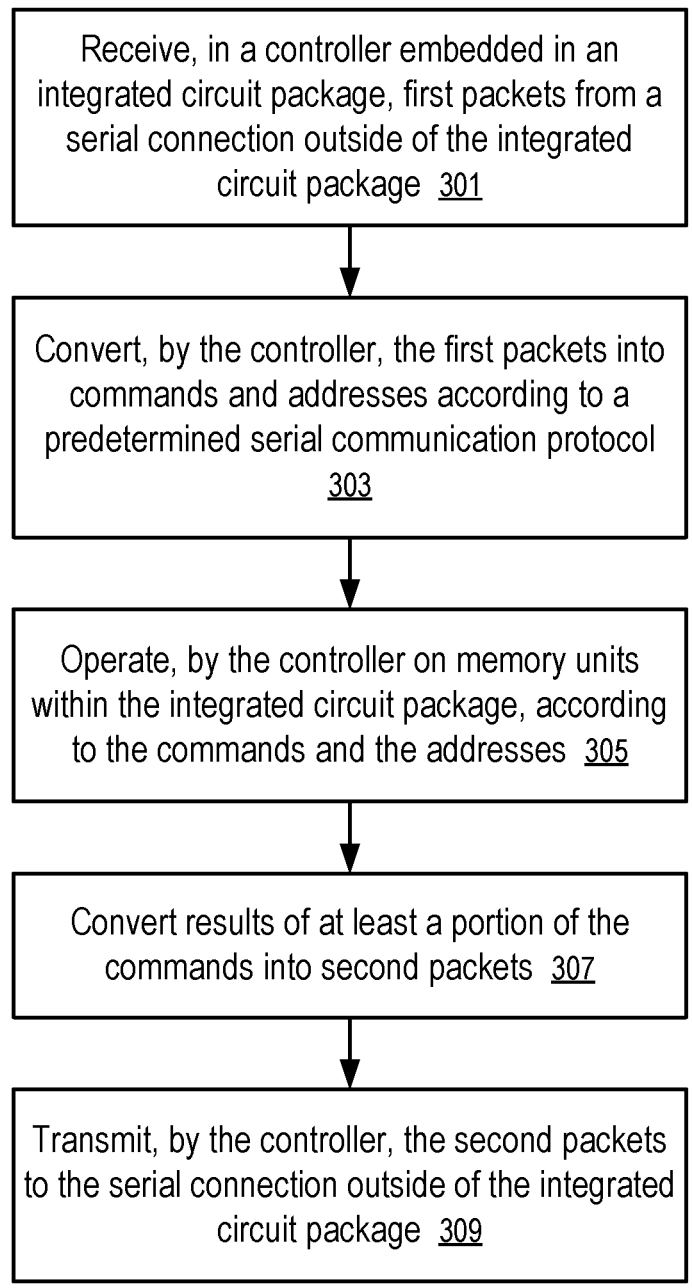
FIG. 8 shows a method of a memory sub-system having an embedded media controller.

FIG. 8 shows a method of a memory sub-system having an embedded media controller. The method of FIG. 8 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 8 is performed at least in part by the embedded controller 104 of FIG. 1, 2, 3, or 4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 8 can be implemented in a computing system of FIG. 1 or 2 with a host operating system 241 of FIG. 6, an embedded controller 104 of FIG. 3 and/or 4, and a prediction model 265 of FIG. 7. For example, the method can be implemented in combination with the data stream segregator 113 of FIG. 4 that is implemented at least in part via the cache controller 273 and the workload recognizer 263 of FIG. 7 and/or the virtual function 247 of FIG. 6.

At block 301, a controller 104 embedded in an integrated circuit package 401 receives first packets from a serial connection 441, . . . , or 443 outside of the integrated circuit package 401.

At block 303, the controller 104 converts the first packets into commands and addresses according to a predetermined serial communication protocol.

At block 305, the controller 104 operates on memory units (e.g., formed on memory IC dies 403, . . . , 405) within the integrated circuit package 401, according to the commands and the addresses.

For example, the integrated circuit package 401 can encapsulate one or more integrated circuit memory dies. In some instances, the multiple integrated circuit memory dies 403, . . . , 405 are encapsulated within the same integrated circuit package 401 and are connected to the embedded controller 104 in parallel.

For example, the memory units encapsulated within the integrated circuit package 401 can include Dynamic Random-Access Memory (DRAM), cross point memory, and/or flash memory.

At block 307, the controller 104 converts results of at least a portion of the commands into second packets.

At block 309, the controller 104 transmits the second packets to the serial connection 441, . . . , or 443 outside of the integrated circuit package 401.

For example, the commands can include a read command to retrieve data from one or more of the memory units; and the embedded controller 104 is configured to transmit the data retrieved according to the read command via the second packets.

For example, the embedded controller 104 can be configured to store status information of the integrated circuit dies 403, . . . , 405. When the commands include a command to retrieve status of an integrated circuit die 403, . . . , or 405; and the embedded controller 104 is configured to transmit the status information using the second packets.

The embedded controller 104 can store a set of media rules that are configurable during the initialization of the memory component encapsulated in the integrated circuit package 401. The embedded controller 104 can include a sequencer 407 configured to implement the media rules by running a microprogram. For example, the embedded controller 104 can store a microprogram and media rules and execute the microprogram to implement media rules during the execution of the commands.

For example, multiple memory components 421, ..., 423 can be each encapsulated in a respective integrated circuit package 401 and can each have an embedded controller 104. Each embedded controller 104 can have a serial communication interface 411 to connect to an serial connection to a second controller 115. The second controller can have multiple serial communication interfaces 411 that are connected to the serial communication interfaces 411 of the memory components 421, ..., 423 respectively via separate serial connections 441, ..., 443 that can be used in parallel.

Further, memory of different performance tiers can be included in the multiple memory components 421, ..., 423. For example, a top tier can have Dynamic Random-Access Memory (DRAM) and/or cross point memory; a middle tier can have Single Level Cell (SLC) flash memory; and a bottom tier can have Triple Level Cell (TLC) flash memory and/or Quad-Level Cell (QLC) flash memory.

Optionally, the second controller 115 can maintain a logical to physical address mapping 433. For example, the second controller 115 can be configured to perform wear leveling 431 across the multiple memory components 421, ..., 423, or its subset, using the logical to physical address mapping 433.

Optionally, the second controller 115 can concurrently use multiple serial communication connections 441, ..., 443 in parallel between the second controller 115 and the plurality of memory components 421, ..., 423 to improve data access performance. The logical to physical address mapping 433 can be dynamically adjusted to facilitate the parallel operations.

Optionally, the second controller 115 can include a hierarchy of controllers (e.g., 227, 229) that are connected via serial communication connections.

In some implementations, a communication channel between the processing device 118 and a memory sub-system includes a computer network, such as a local area network, a wireless local area network, a wireless personal area network, a cellular communications network, a broadband high-speed always-connected wireless communication connection (e.g., a current or future generation of mobile network link); and the processing device 118 and the memory sub-system can be configured to communicate with each other using data storage management and usage commands similar to those in NVMe protocol.

A memory sub-system in general can have non-volatile storage media. Examples of non-volatile storage media include memory cells formed in an integrated circuit and magnetic material coated on rigid disks. Non-volatile storage media can maintain the data/information stored therein without consuming power. Memory cells can be implemented using various memory/storage technologies, such as NAND logic gate, NOR logic gate, phase-change memory (PCM), magnetic memory (MRAM), resistive random-access memory, cross point storage and memory devices (e.g., 3D XPoint memory). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

The controller (e.g., 227, or 229) of a memory sub-system (e.g., 205 or 209) can run firmware to perform operations responsive to the communications from the processing device 118. Firmware in general is a type of computer program that provides control, monitoring and data manipulation of engineered computing devices.

Some embodiments involving the operation of the controller 227 can be implemented using computer instructions executed by the controller 227, such as the firmware of the controller 227. In some instances, hardware circuits can be used to implement at least some of the functions. The firmware can be initially stored in the non-volatile storage media, or another non-volatile device, and loaded into the volatile DRAM and/or the in-processor cache memory for execution by the controller 227.

A non-transitory computer storage medium can be used to store instructions of the firmware of a memory sub-system (e.g., 209 or 205) and/or the instructions of the operating system (e.g., 241, 243) in general and the device driver and the hypervisor 245 in particular. When the instructions are executed by the controller 227 and/or the processing device 118, the instructions cause the controller 227 and/or the processing device 118 to perform a method discussed above.

Figure 9:
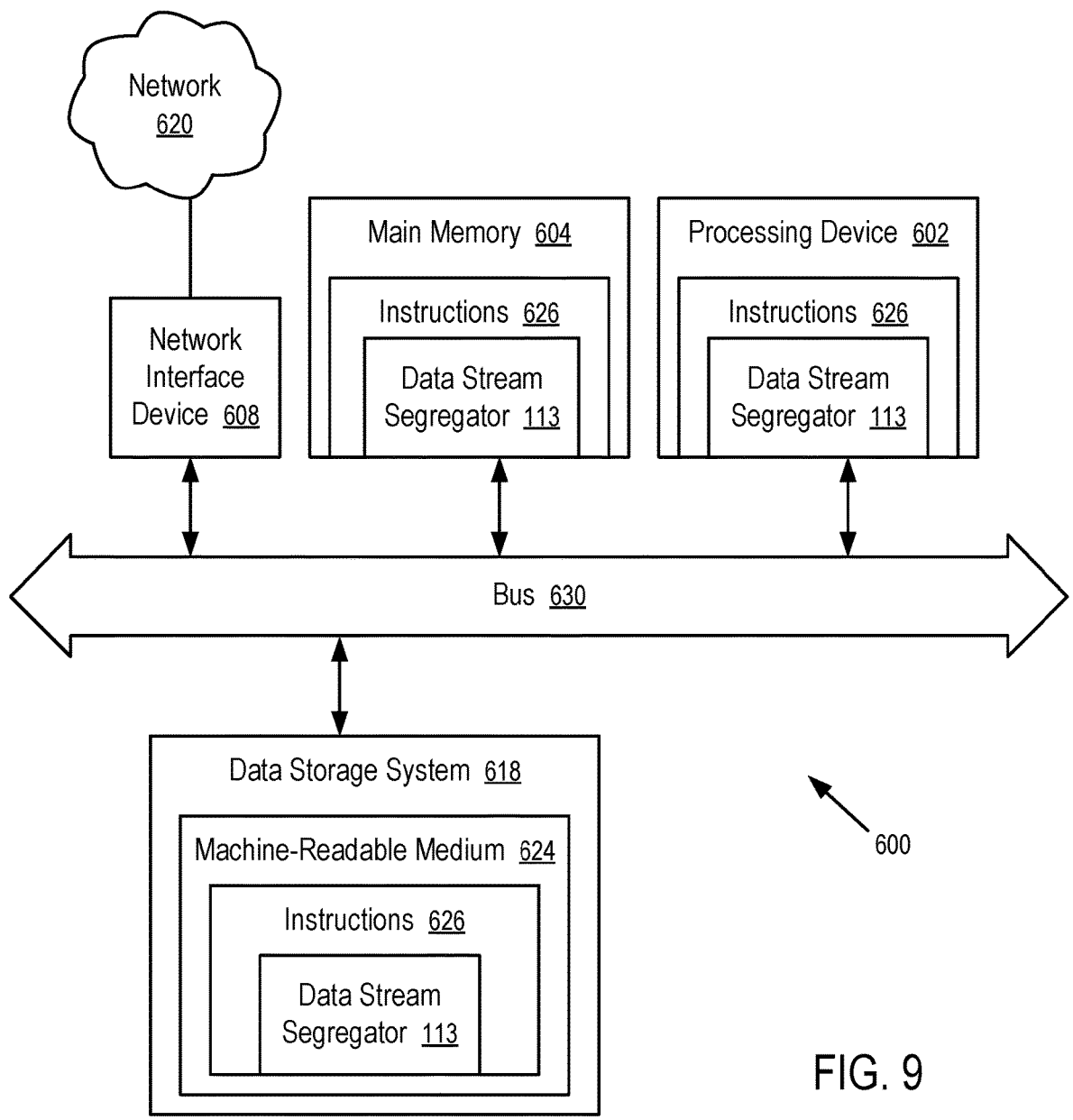
FIG. 9 is a block diagram of an example computer system in which embodiments of the present disclosure can operate.

FIG. 9 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a data stream segregator 113 (e.g., to execute instructions to perform operations corresponding to the data stream segregator 113 described with reference to FIGS. 1-8). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 618, which communicate with each other via a bus 630 (which can include multiple buses).

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data stream segregator 113 (e.g., the data stream segregator 113 described with reference to FIGS. 1-8). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A memory component, comprising:
  integrated circuit memory dies having a plurality of memory units, each die of the integrated circuit memory dies having at least one memory unit, and the integrated circuit memory dies including a first memory tier having a first access speed, and a second memory tier having a second access speed slower than the first access speed, wherein:
  the first memory tier comprises at least one of static random-access memory, dynamic random-access memory, or cross point memory; and
  the second memory tier comprises at least one of cross point memory, single level cell flash memory, triple level cell flash memory, or quad-level cell flash memory;
an embedded controller comprising a serial communication interface, the embedded controller being coupled to the first memory tier and to the second memory tier, the embedded controller constructed in a die separated from the integrated circuit memory dies and configured to receive packets via the serial communication interface, wherein the embedded controller is configured to store status information of the integrated circuit memory dies; and
an integrated circuit package that encapsulates the embedded controller and the integrated circuit memory dies;
wherein the embedded controller is configured to at least:
  receive a data access stream comprising data access requests, via the serial communication interface, from a serial connection outside of the integrated circuit package;
  direct the data access stream to the first memory tier, wherein the first memory tier is used as a cache;
  determine a cache hit ratio indicative of:
    a number of cache hits comprising a first number of the data access requests that request data stored in the cache of the first memory tier as compared to
    a number of cache misses comprising a second number of the data access requests that request data not stored in the cache of the first memory tier;
  identify data movements implemented by the embedded controller responsive to the data access requests;
  determine, using a trained prediction model comprising a model trained using:
    the identified data movements; and
    virtual functions configured to identify at least one of (i) an identity of a virtual machine associated with a given data access request, (ii) an identity of an application associated with the given data access request, or (iii) an identity of a user account associated with the given data access request,
    predicted data movements to move data between the first memory tier and the second memory tier to increase the cache hit ratio;
  implement, continuously and in real time based on new data access requests, the predicted data movements to increase the cache hit ratio for responding to the new data access requests;
  receive a command to retrieve status of the integrated circuit memory dies; and
  transmit the status information responsive to the command.

2. The memory component of claim 1, wherein the integrated circuit memory dies include multiple dies connected to the embedded controller in parallel.

3. The memory component of claim 2, wherein the memory units include flash memory in the second memory tier.

4. The memory component of claim 1, wherein the data access stream is detected by the controller to require more frequent access than another data access stream.

5. A method, comprising:
  receiving, in a controller embedded in an integrated circuit package, a data access stream comprising data access requests from a serial connection outside of the integrated circuit package, wherein:
    the integrated circuit package encapsulates the controller, a first memory tier, and a second memory tier; and
    the second memory tier has a second access speed slower than a first access speed of the first memory tier;
  directing the data access stream to the first memory tier, wherein the first memory tier is used as a cache;
  determining a cache hit ratio indicative of:
    a number of cache hits comprising a first number of the data access requests that request data stored in the cache of the first memory tier as compared to
    a number of cache misses comprising a second number of the data access requests that request data not stored in the cache of the first memory tier;
  identifying data movements implemented by the embedded controller responsive to the data access requests;
  determining, using a trained prediction model comprising a model trained using:
    the identified data movements; and
    virtual functions configured to identify at least one of (i) an identity of a virtual machine associated with a given data access request, (ii) an identity of an application associated with the given data access request, or (iii) an identity of a user account associated with the given data access request,
    predicted data movements to move data between the first memory tier and the second memory tier to increase the cache hit ratio, and wherein the controller is configured to store status information of the first memory tier and the second memory tier;
  implementing, continuously and in real time based on new data access requests, the predicted data movements to increase the cache hit ratio for responding to the new data access requests
  maintaining, in the controller, status information of the first memory tier and the second memory tier encapsulated within the integrated circuit package;
  receiving a command to retrieve status of the first memory tier and the second memory tier; and
  transmitting the status information responsive to the command,
  wherein the first memory tier comprises at least one of static random-access memory, dynamic random-access memory, or cross point memory, and
  wherein the second memory tier comprises at least one of cross point memory, single level cell flash memory, triple level cell flash memory, or quad-level cell flash memory.

6. The method of claim 5, wherein the integrated circuit memory dies include multiple dies connected to the embedded controller in parallel.

7. The method of claim 6, wherein the memory units include flash memory in the first memory tier.

8. The method of claim 5, wherein the commands further include a read command to retrieve data from one or more of the memory units; and the embedded controller is configured to transmit the data retrieved according to the read command via first packets.

9. The method of claim 5, wherein the data access stream is detected by the controller to require more frequent access than another data access stream.

\* \* \* \* \*